(12) United States Patent
Yu et al.

(10) Patent No.: US 11,139,249 B2
(45) Date of Patent: Oct. 5, 2021

(54) SEMICONDUCTOR DEVICES AND METHODS OF FORMING THE SAME

(71) Applicant: Taiwan Semiconductor Manufacturing Company, Ltd., Hsinchu (TW)

(72) Inventors: Chen-Hua Yu, Hsinchu (TW); Hung-Yi Kuo, Taipei (TW); Chung-Shi Liu, Hsinchu (TW); Hao-Yi Tsai, Hsinchu (TW); Cheng-Chieh Hsieh, Tainan (TW); Tsung-Yuan Yu, Taipei (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 16/783,392

(22) Filed: Feb. 6, 2020

(65) Prior Publication Data

US 2020/0312774 A1 Oct. 1, 2020

Related U.S. Application Data

(60) Provisional application No. 62/827,575, filed on Apr. 1, 2019.

(51) Int. Cl.
*H01L 23/538* (2006.01)
*H01L 25/065* (2006.01)
(Continued)

(52) U.S. Cl.
CPC .......... *H01L 23/5389* (2013.01); *H01L 21/56* (2013.01); *H01L 23/49861* (2013.01);
(Continued)

(58) Field of Classification Search
CPC ..................................................... H01L 21/56
See application file for complete search history.

(56) References Cited

U.S. PATENT DOCUMENTS

| 8,993,380 B2 | 3/2015 | Hou et al. |
| 9,281,254 B2 | 3/2016 | Yu et al. |

(Continued)

FOREIGN PATENT DOCUMENTS

| KR | 20170033390 A | 3/2017 |
| KR | 20180032516 A | 3/2018 |
| KR | 20180099417 A | 9/2018 |

*Primary Examiner* — Thao P Le
(74) *Attorney, Agent, or Firm* — Slater Matsil, LLP

(57) ABSTRACT

A packaged semiconductor device including a first die attached to a redistribution structure, a second die attached to the first die, and a molding compound surrounding the first die and the second die and a method of forming the same are disclosed. In an embodiment, a method includes forming first conductive pillars over and electrically coupled to a first redistribution structure; attaching a first die to the first redistribution structure, the first die including second conductive pillars; attaching a second die to the first die adjacent the second conductive pillars; encapsulating the first conductive pillars, the first die, and the second die with an encapsulant; forming a second redistribution structure over the encapsulant, the first conductive pillars, the first die, and the second die; and bonding a third die to the first redistribution structure.

20 Claims, 20 Drawing Sheets

(51) Int. Cl.
  *H01L 21/56* (2006.01)
  *H01L 23/498* (2006.01)
  *H01L 25/00* (2006.01)

(52) U.S. Cl.
  CPC .......... *H01L 25/0655* (2013.01); *H01L 25/50* (2013.01); *H01L 2924/1436* (2013.01)

(56) References Cited

U.S. PATENT DOCUMENTS

| | | | |
|---|---|---|---|
| 9,299,649 | B2 | 3/2016 | Chiu et al. |
| 9,372,206 | B2 | 6/2016 | Wu et al. |
| 9,425,126 | B2 | 8/2016 | Kuo et al. |
| 9,443,783 | B2 | 9/2016 | Lin et al. |
| 9,461,018 | B1 | 10/2016 | Tsai et al. |
| 9,496,189 | B2 | 11/2016 | Yu et al. |
| 9,666,502 | B2 | 5/2017 | Chen et al. |
| 9,735,131 | B2 | 8/2017 | Su et al. |
| 2004/0026789 | A1 | 2/2004 | Michii |
| 2007/0231970 | A1* | 10/2007 | Fukuo ................. H01L 25/0657 438/127 |
| 2014/0091471 | A1* | 4/2014 | Chen ....................... H01L 25/18 257/770 |
| 2015/0091160 | A1* | 4/2015 | Reber ................. H01L 25/0657 257/737 |
| 2015/0091178 | A1* | 4/2015 | Reber .................... H01L 23/481 257/774 |
| 2016/0079095 | A1 | 3/2016 | St. Germain et al. |
| 2016/0092383 | A1 | 3/2016 | Bains et al. |
| 2016/0300781 | A1* | 10/2016 | Xue ...................... B81B 7/0048 |
| 2016/0322343 | A1* | 11/2016 | Scanlan ................ H01L 21/565 |
| 2017/0117251 | A1 | 4/2017 | Khan et al. |
| 2017/0207197 | A1 | 7/2017 | Yu et al. |
| 2017/0278825 | A1* | 9/2017 | Lakhera ................ H01L 21/565 |
| 2018/0082964 | A1 | 3/2018 | Wu et al. |
| 2018/0096925 | A1 | 4/2018 | St. Germain et al. |
| 2018/0247916 | A1 | 8/2018 | Lee et al. |
| 2019/0326259 | A1* | 10/2019 | Yu ....................... H01L 23/3114 |

\* cited by examiner

SEMICONDUCTOR DEVICES AND METHODS OF FORMING THE SAME

PRIORITY CLAIM AND CROSS-REFERENCE

This application claims the benefit of U.S. Provisional Application No. 62/827,575, filed on Apr. 1, 2019, entitled "Semiconductor Devices and Methods of Forming the Same," which application is hereby incorporated herein by reference.

BACKGROUND

Semiconductor devices are used in a variety of electronic applications, such as, for example, personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography to form circuit components and elements thereon.

The semiconductor industry continues to improve the integration density of various electronic components (e.g., transistors, diodes, resistors, capacitors, etc.) by continual reductions in minimum feature size, which allow more components to be integrated into a given area. However, as the minimum features sizes are reduced, additional problems arise that should be addressed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
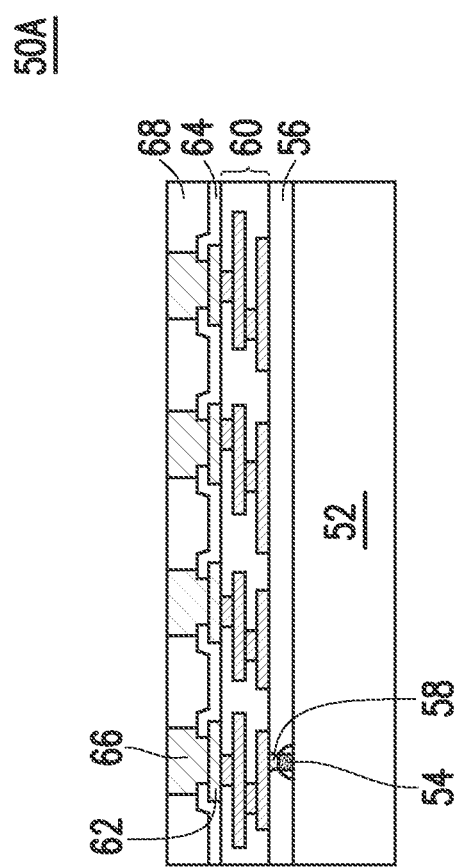
FIGS. 1-14 illustrate cross-sectional views of intermediate steps during a process for forming a packaged semiconductor device, in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Various embodiments provide improved die stacking structures and packaged semiconductor devices including the same. The die stacking structures may be formed by forming first conductive pillars on a back-side redistribution structure; attaching a first active device die including second conductive pillars to the back-side redistribution structure; and attaching a second active device die to the first active device die. A front-side redistribution structure may be formed over the first conductive pillars, the second conductive pillars, and the second active device die and a package component may be attached to the back-side redistribution structure. Using this method allows for the first active device die, the second active device die, and the package component to be interconnected in a packaged semiconductor device with a minimal area. Moreover, a molding compound can be formed around the first active device die and the second active device die simultaneously with a single molding step and a single grinding step. Any of the first and second conductive pillars may be oval-shaped or round-shaped to reduce stress in the packaged semiconductor device.

FIGS. 1-14 are cross-sectional views of intermediate stages in the manufacturing of a packaged semiconductor device 200, in accordance with some embodiments. FIG. 1 illustrates an active device die 50A, in accordance with some embodiments. The active device die 50A will be packaged in subsequent processing to form an integrated circuit package. In an embodiment, the active device die 50A may be a system-on-chip (SoC). In further embodiments, the active device die 50A may be a logic die (e.g., central processing unit (CPU), a graphics processing unit (GPU), an application processor (AP), a microcontroller, or the like), a memory die (e.g., a dynamic random access memory (DRAM) die, a static random access memory (SRAM) die, a high bandwidth memory (HBM) die, or the like), an input/output (I/O) interface die, a power management die (e.g., a power management integrated circuit (PMIC) die or the like), a radio frequency (RF) die, a sensor die, a micro-electro-mechanical-system (MEMS) die, a signal processing die (e.g., a digital signal processing (DSP) die or the like), a front-end die (e.g., an analog front-end (AFE) die or the like), the like, or combinations thereof. The active device die 50A may have a length from about 9 mm to about 12 mm and a width from about 9 mm to about 12 mm in a top-down view.

The active device die 50A may be formed in a wafer, which may include different device regions that are singulated in subsequent steps to form a plurality of active device dies. The active device die 50A may be processed according to applicable manufacturing processes to form integrated circuits. For example, the active device die 50A includes a semiconductor substrate 52, such as silicon, doped or undoped, or an active layer of a semiconductor-on-insulator (SOI) substrate. The semiconductor substrate 52 may include other semiconductor materials, such as germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. Other substrates, such as multi-layered or gradient substrates, may also be used. The semiconductor substrate 52 has an active surface (e.g., the surface facing upwards in FIG. 1), sometimes called a front-side, and an inactive surface (e.g., the surface facing downwards in FIG. 1), sometimes called a back-side.

Devices 54 may be formed at the front side of the semiconductor substrate 52. The devices 54 may be active devices (e.g., transistors, diodes, or the like), capacitors, resistors, or the like. An inter-layer dielectric (ILD) 56 is formed over the front side of the semiconductor substrate 52. The ILD 56 surrounds and may cover the devices 54. The ILD 56 may include one or more dielectric layers formed of materials such as phosphosilicate glass (PSG), borosilicate glass (BSG), boron-doped phosphosilicate glass (BPSG), undoped silicate glass (USG), or the like.

Conductive plugs 58 extend through the ILD 56 to electrically and physically couple the devices 54. For example, when the devices 54 are transistors, the conductive plugs 58 may couple the gates and source/drain regions of the transistors. The conductive plugs 58 may be formed of tungsten, cobalt, nickel, copper, silver, gold, aluminum, the like, or combinations thereof. An interconnect structure 60 is included over the ILD 56 and the conductive plugs 58. The interconnect structure 60 interconnects the devices 54 to form an integrated circuit. The interconnect structure 60 may be formed by, for example, metallization patterns in dielectric layers on the ILD 56. The metallization patterns include metal lines and vias formed in one or more low-k dielectric layers. The metallization patterns of the interconnect structure 60 are electrically coupled to the devices 54 by the conductive plugs 58.

The active device die 50A further includes pads 62, such as aluminum pads, to which external connections are made. The pads 62 are on the active side of the active device die 50A, such as in and/or on the interconnect structure 60. One or more passivation films 64 are on the active device die 50A, such as on portions of the interconnect structure 60 and the pads 62. Openings extend through the passivation films 64 to the pads 62. Die connectors 66, such as conductive pillars (formed of a metal such as copper, for example), extend through the openings in the passivation films 64 and are physically and electrically coupled to respective ones of the pads 62. The die connectors 66 may be formed by, for example, plating, or the like. The die connectors 66 electrically couple the respective integrated circuits of the active device die 50A.

Optionally, solder regions (e.g., solder balls or solder bumps) may be disposed on the pads 62. The solder balls may be used to perform chip probe (CP) testing on the active device die 50A. The CP testing may be performed on the active device die 50A to ascertain whether the active device die 50A is a known good die (KGD). Thus, only active device dies 50A, which are KGDs, undergo subsequent processing are packaged, and dies, which fail the CP testing, are not packaged. After testing, the solder regions may be removed in subsequent processing steps.

A dielectric layer 68 may be on the front side of the active device die 50A, such as on the passivation films 64 and the die connectors 66. The dielectric layer 68 laterally encapsulates the die connectors 66, and the dielectric layer 68 is laterally coterminous with the active device die 50A. Initially, the dielectric layer 68 may bury the die connectors 66, such that a topmost surface of the dielectric layer 68 is above topmost surfaces of the die connectors 66. In some embodiments where solder regions are disposed on the die connectors 66, the dielectric layer 68 may bury the solder regions as well. Alternatively, the solder regions may be removed prior to forming the dielectric layer 68.

The dielectric layer 68 may be a polymer such as PBO, polyimide, BCB, or the like; a nitride such as silicon nitride or the like; an oxide such as silicon oxide, PSG, BSG, BPSG, or the like; the like, or a combination thereof. The dielectric layer 68 may be formed, for example, by spin coating, lamination, CVD, or the like. In some embodiments, the die connectors 66 are exposed through the dielectric layer 68 during formation of the active device die 50A. In some embodiments, the die connectors 66 remain buried and are exposed during a subsequent process for packaging the active device die 50A. Exposing the die connectors 66 may remove any solder regions that may be present on the die connectors 66.

In some embodiments, the active device die 50A is a stacked device that includes multiple semiconductor substrates 52. For example, the active device die 50A may be a memory device such as a hybrid memory cube (HMC) module, a high bandwidth memory (HBM) module, or the like that includes multiple memory dies. In such embodiments, the active device die 50A includes multiple semiconductor substrates 52 interconnected by through-substrate vias (TSVs). Each of the semiconductor substrates 52 may have an interconnect structure 60.

Figure 2:
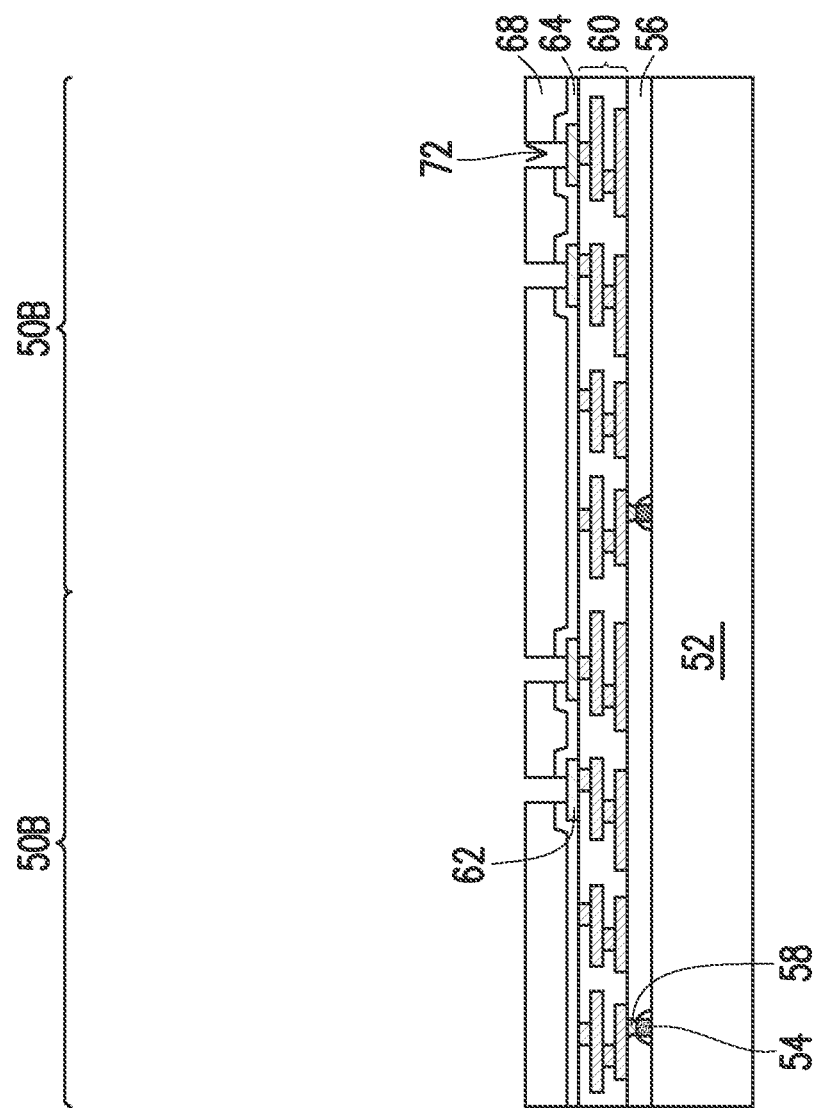
Figure 3:
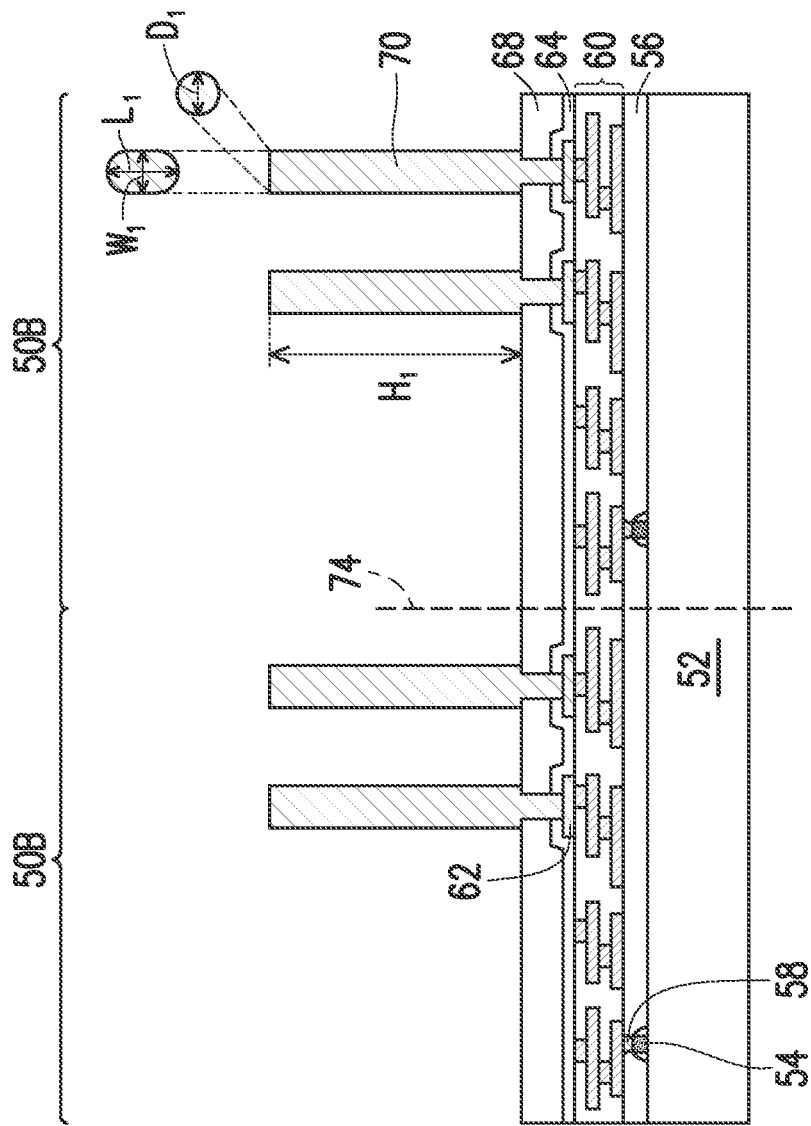
Figure 4:
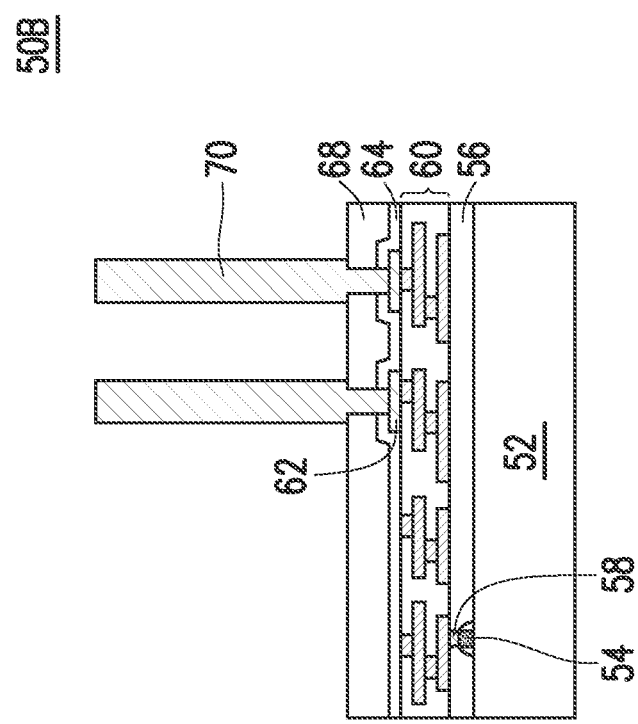

FIGS. 2-4 illustrate cross-sectional views of intermediate steps during a process for forming an active device die 50B. The active device die 50B may be the same as, or similar to the active device die 50A illustrated in FIG. 1, with the active device die 50B including conductive pillars 70 (illustrated in FIG. 4) in place of the die connectors 66. In an embodiment, the active device die 50B may be a wide input/output (WIO) memory die. In the discussion herein, unless otherwise specified, the same or similar numerals refer to the same or similar components that are formed using a same or similar material by a same or similar method, thus details may not be repeated.

In FIG. 2, two active device dies 50B are provided on the same semiconductor substrate 52, which may be a wafer, prior to singulation. Although two pads 62 are illustrated in each of the active device dies 50B, any number of pads 62 may be present. One or more passivation films 64 are formed over the pads 62 and a dielectric layer 68 is formed over the passivation films 64. The dielectric layer 68 and the passivation films 64 may be patterned to form openings 72 exposing portions of the pads 62. The patterning may be performed by an acceptable process, such as by exposing the dielectric layer 68 to light when the dielectric layer 68 is a photo-sensitive material or by etching using, for example, an anisotropic etch. In embodiments in which the dielectric layer 68 is a photo-sensitive material, the dielectric layer 68 may be developed after the exposure to light.

In FIG. 3, conductive pillars 70 are formed in the openings 72 and extending above the dielectric layer 68. As an example, the conductive pillars 70 may be formed by first forming a seed layer over the dielectric layer 68 and portions of the passivation films 64 and the pads 62 exposed by the openings 72. In some embodiments, the seed layer is a metal layer, which may be a single layer or a composite layer comprising a plurality of sub-layers formed of different materials. In a particular embodiment, the seed layer comprises a titanium layer and a copper layer over the titanium layer. The seed layer may be formed using, for example, PVD or the like. A photoresist is formed and patterned on the seed layer. The photoresist may be formed by spin coating or the like and may be exposed to light for patterning. The pattern of the photoresist corresponds to the conductive pillars 70. The patterning forms openings through the photoresist to expose the seed layer. A conductive material is formed in the openings of the photoresist and on the exposed portions of the seed layer. The conductive material may be formed by plating, such as electroplating or electroless plating, or the like. The conductive material may comprise a metal, such as copper, titanium, tungsten, aluminum, or the like. The photoresist and portions of the seed layer on which the conductive material is not formed are removed. The photoresist may be removed by an acceptable ashing or stripping process, such as a process using an oxygen plasma or the like. Once the photoresist is removed, exposed portions of the seed layer are removed using an acceptable etching process, such as wet or dry etching. The remaining portions of the seed layer and the conductive material form the conductive pillars 70.

FIG. 3 further illustrates cross sections of the conductive pillars 70. As illustrated in FIG. 3 the conductive pillars 70 may have circular cross-sectional shapes or oval cross-sectional shapes. Some of the conductive pillars 70 may have circular cross-sectional shapes, while others of the conductive pillars 70 may have oval cross-sectional shapes. Other cross-sectional shapes, such as square, rectangular, polygonal, or the like may also be possible. In embodiments in which the conductive pillars 70 have circular cross-sectional shapes, the conductive pillars 70 may have diameters $D_1$ from about 15 µm to about 40 µm, such as about 20 µm. In embodiments in which the conductive pillars 70 have oval cross-sectional shapes, a length $L_1$ of the conductive pillars 70 in a top-down view may be from about 20 µm to about 50 µm, such as about 35 µm and a width $W_1$ of the conductive pillars 70 in the top-down view may be from about 15 µm to about 40 µm, such as about 25 µm. Portions of the conductive pillars 70 extending above the dielectric layer 68 may have heights $H_1$ from about 100 µm to about 120 µm, which may be greater than a height of a die subsequently placed over the active device die 50B (e.g., the active device die 50A illustrated in FIG. 9).

In FIG. 4, the semiconductor substrate 52 is thinned and the active device dies 50B are singulated. The semiconductor substrate may be thinned using a mechanical grinding or a chemical mechanical polishing (CMP) process whereby chemical etchants and abrasives are utilized to react and grind away the semiconductor substrate 52 until the semiconductor substrate 52 reaches a desired thickness. The active device dies 50B may be singulated using a dicing process such as sawing, laser drilling, or the like. The active device dies 50B may be singulated along a scribe line area 74, illustrated in FIG. 3. The active device dies 50B may each have a length from about 9 mm to about 12 mm and a width from about 7 mm to about 12 mm in a top-down view. In some embodiments, the front sides of the active device dies 50B may be placed on a tape with the conductive pillars 70 extending into the tape prior to the thinning and singulation. The tape may have a thickness greater than a height of the conductive pillars 70 such that the conductive pillars 70 are surrounded by the tape. The tape may comprise a polymer material, an adhesive material, or the like.

Figure 5:
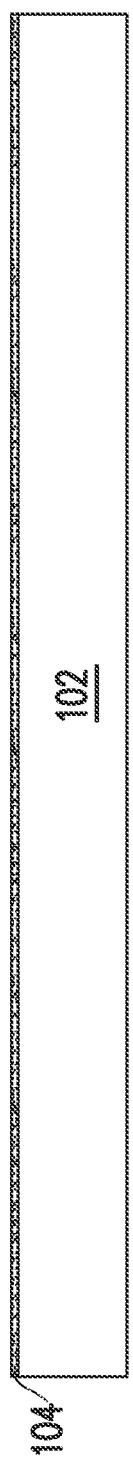

In FIG. 5, a carrier substrate 102 is provided, and a release layer 104 is formed on the carrier substrate 102. The carrier substrate 102 may be a glass carrier substrate, a ceramic carrier substrate, or the like. The carrier substrate 102 may be a wafer, such that multiple packages can be formed on the carrier substrate 102 simultaneously.

The release layer 104 may be formed of a polymer-based material, which may be removed along with the carrier substrate 102 from overlying structures that will be formed in subsequent steps. In some embodiments, the release layer 104 is an epoxy-based thermal-release material, which loses its adhesive property when heated, such as a light-to-heat-conversion (LTHC) release coating. In other embodiments, the release layer 104 may be an ultra-violet (UV) glue, which loses its adhesive property when exposed to UV light. The release layer 104 may be dispensed as a liquid and cured, may be a laminate film laminated onto the carrier substrate 102, or may be the like. A top surface of the release layer 104 may be leveled and may have a high degree of planarity.

Figure 6:
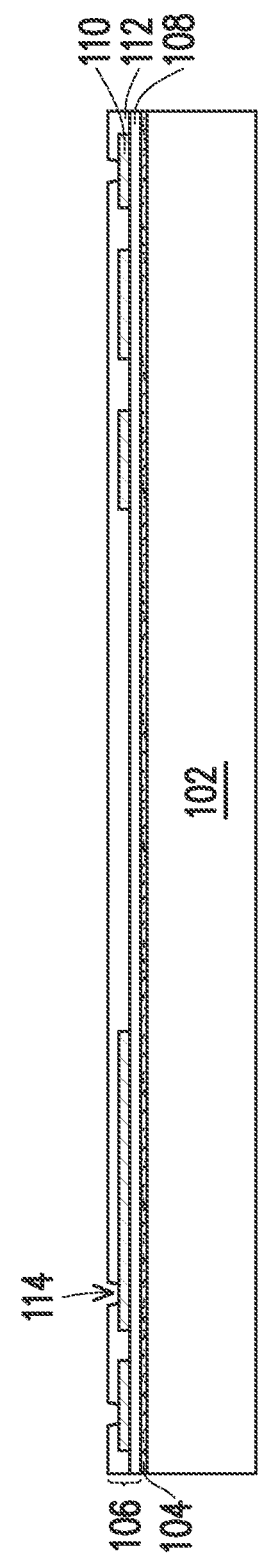

In FIG. 6, a back-side redistribution structure 106 may be formed on the release layer 104. In the embodiment shown, the back-side redistribution structure 106 includes a dielectric layer 108, a metallization pattern 110 (sometimes referred to as redistribution layers or redistribution lines), and a dielectric layer 112. The back-side redistribution structure 106 is optional. In some embodiments, a dielectric layer without metallization patterns is formed on the release layer 104 in lieu of the back-side redistribution structure 106.

The dielectric layer 108 may be formed on the release layer 104. The bottom surface of the dielectric layer 108 may be in contact with the top surface of the release layer 104. In some embodiments, the dielectric layer 108 is formed of a polymer, such as polybenzoxazole (PBO), polyimide, benzocyclobutene (BCB), or the like. In other embodiments, the dielectric layer 108 is formed of a nitride, such as silicon nitride; an oxide, such as silicon oxide, phosphosilicate glass (PSG), borosilicate glass (BSG), boron-doped phosphosilicate glass (BPSG), or the like; or the like. The dielectric layer 108 may be formed by any acceptable deposition process, such as spin coating, chemical vapor deposition (CVD), laminating, the like, or a combination thereof.

The metallization pattern 110 may be formed on the dielectric layer 108. As an example, the metallization pattern 110 may be formed by first forming a seed layer over the dielectric layer 108. In some embodiments, the seed layer is a metal layer, which may be a single layer or a composite layer comprising a plurality of sub-layers formed of different materials. In some embodiments, the seed layer comprises a titanium layer and a copper layer over the titanium layer. The seed layer may be formed using, for example, physical vapor deposition (PVD) or the like. A photoresist is then formed and patterned on the seed layer. The photoresist may be formed by spin coating or the like and may be exposed to light for patterning. The pattern of the photoresist corresponds to the metallization pattern 110. The patterning forms openings through the photoresist to expose the seed layer. A conductive material is formed in the openings of the photoresist and on the exposed portions of the seed layer. The conductive material may be formed by plating, such as electroplating or electroless plating, or the like. The conductive material may comprise a metal such as copper, titanium, tungsten, aluminum, or the like. The photoresist and portions of the seed layer on which the conductive material is not formed are then removed. The photoresist may be removed by an acceptable ashing or stripping process, such as a process using an oxygen plasma or the like. Once the photoresist is removed, exposed portions of the seed layer are removed using an acceptable etching process, such as wet or dry etching. The remaining portions of the seed layer and the conductive material form the metallization pattern 110.

The dielectric layer 112 may be formed on the metallization pattern 110 and the dielectric layer 108. In some embodiments, the dielectric layer 112 is formed of a polymer, which may be a photo-sensitive material such as PBO, polyimide, BCB, or the like, which may be patterned using a lithography mask. In other embodiments, the dielectric layer 112 is formed of a nitride, such as silicon nitride; an oxide, such as silicon oxide, PSG, BSG, BPSG; or the like. The dielectric layer 112 may be formed by spin coating, lamination, CVD, the like, or a combination thereof. The dielectric layer 112 may be patterned to form openings 114 exposing portions of the metallization pattern 110. The patterning may be performed by an acceptable process, such as by exposing the dielectric layer 112 to light when the dielectric layer 112 is a photo-sensitive material or by etching using, for example, an anisotropic etch. In embodiments in which the dielectric layer 112 is a photo-sensitive material, the dielectric layer 112 may be developed after the exposure to light.

It should be appreciated that the back-side redistribution structure 106 may include any number of dielectric layers and metallization patterns. If more dielectric layers and metallization patterns are to be formed, the steps and processes discussed above may be repeated. The metallization patterns may include conductive lines and conductive vias. The conductive vias may be formed during the formation of the metallization patterns by forming the seed layer and the conductive material of the metallization pattern in an opening of the underlying dielectric layer. The conductive vias may interconnect and electrically couple the various conductive lines of the metallization patterns.

Figure 7:
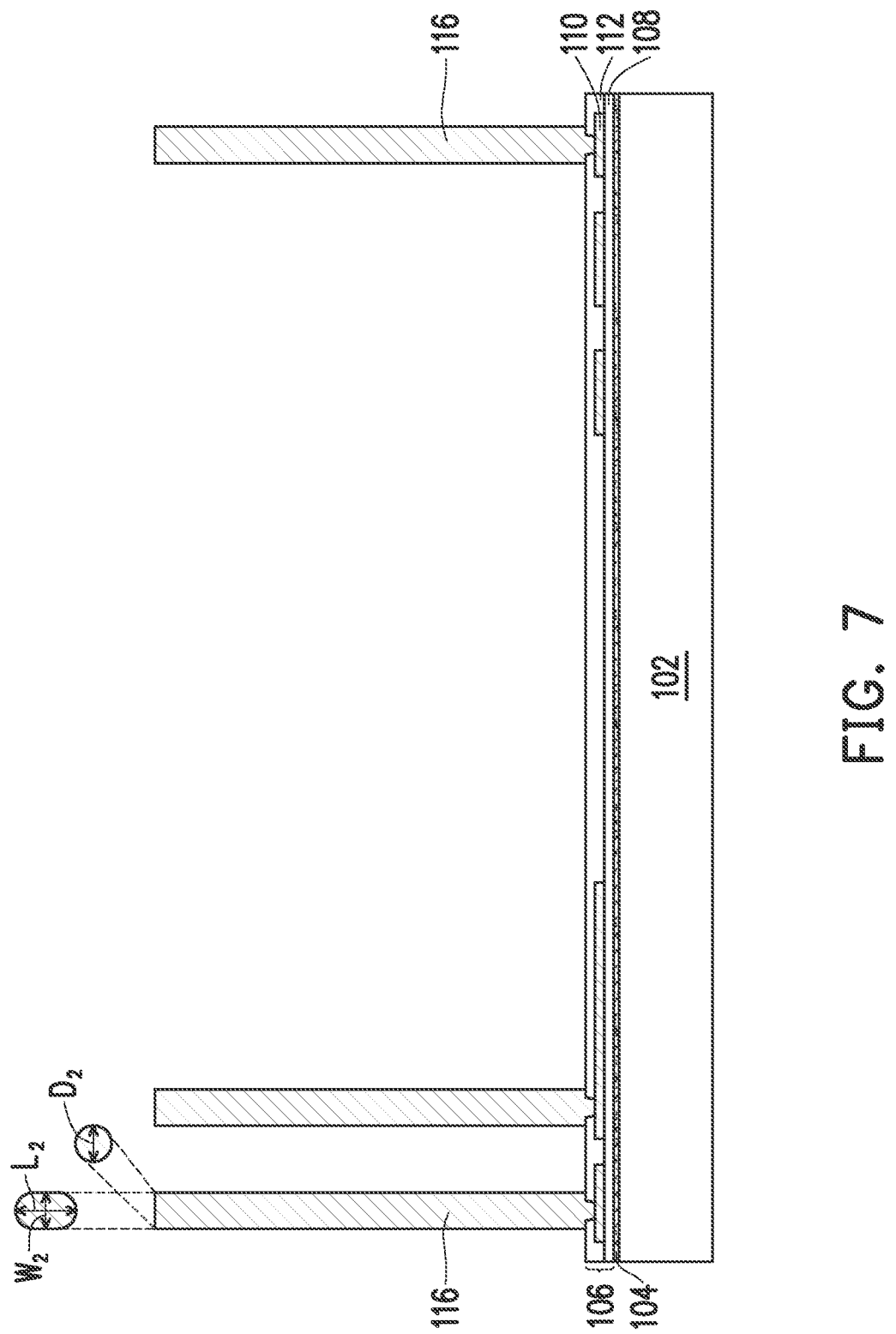

In FIG. 7, conductive pillars 116 are formed in the openings 114 (illustrated in FIG. 6) and extending above a topmost dielectric layer of the back-side redistribution structure 106 (e.g., the dielectric layer 112 in the embodiment illustrated in FIG. 6). The conductive pillars 116 may be used to electrically couple the back-side redistribution structure 106 with a subsequently formed front-side redistribution structure (e.g., the front-side redistribution structure 128 illustrated in FIG. 11). In some embodiments, at least some of the conductive pillars may not be electrically coupled to the back-side redistribution structure 106 and the front-side redistribution structure 128 and may be used for thermal dissipation. As an example, the conductive pillars 116 may be formed by first forming a seed layer over the back-side redistribution structure 106, e.g., on the dielectric layer 112 and portions of the metallization pattern 110 exposed by the openings 114. In some embodiments, the seed layer is a metal layer, which may be a single layer or a composite layer comprising a plurality of sub-layers formed of different materials. In a particular embodiment, the seed layer comprises a titanium layer and a copper layer over the titanium layer. The seed layer may be formed using, for example, PVD or the like. A photoresist is formed and patterned on the seed layer. The photoresist may be formed by spin coating or the like and may be exposed to light for patterning. The pattern of the photoresist corresponds to the conductive pillars 116. The patterning forms openings through the photoresist to expose the seed layer. A conductive material is formed in the openings of the photoresist and on the exposed portions of the seed layer. The conductive material may be formed by plating, such as electroplating or electroless plating, or the like. The conductive material may comprise a metal, such as copper, titanium, tungsten, aluminum, or the like. The photoresist and portions of the seed layer on which the conductive material is not formed are removed. The photoresist may be removed by an acceptable ashing or stripping process, such as a process using an oxygen plasma or the like. Once the photoresist is removed, exposed portions of the seed layer are removed using an acceptable etching process, such as wet or dry etching. The remaining portions of the seed layer and the conductive material form the conductive pillars 116.

FIG. 7 further illustrates cross sections of the conductive pillars 116. As illustrated in FIG. 7, the conductive pillars 116 may have circular cross-sectional shapes or oval cross-sectional shapes. Some of the conductive pillars 116 may have circular cross-sectional shapes, while others of the conductive pillars 116 may have oval cross-sectional shapes. Other cross-sectional shapes, such as square, rectangular, polygonal, or the like may also be possible. In embodiments in which the conductive pillars 116 have circular cross-sectional shapes, the conductive pillars 116 may have diameters $D_2$ from about 40 µm to about 150 µm, such as about 50 µm or about 90 µm. In embodiments in which the conductive pillars 116 have oval cross-sectional shapes, a length $L_2$ of the conductive pillars 116 in a top-down view may be from about 40 µm to about 150 µm, such as about 60 µm and a width $W_2$ of the conductive pillars 116 in the top-down view may be from about 20 µm to about 130 µm, such as about 30 µm. The conductive pillars 116 may have a pitch from about 80 µm to about 250 µm, such as about 200 µm.

In some embodiments, the conductive pillars 116 may be used to electrically couple a subsequently attached active device die (e.g., the active device die 50A, illustrated in FIG. 9) and a subsequently attached package component (e.g., the package component 150, illustrated in FIG. 14) to a subsequently attached active device die (e.g., the active device die 50B, illustrated in FIG. 8). In an embodiment, the conductive pillars 116 electrically coupled to the package component 150 may be oval-shaped and may have a pitch from about 80 µm to about 250 µm and the conductive pillars 116 electrically coupled to the active device die 50A may be circular-shaped and may have a pitch from about 80 µm to about 250 µm. Using the oval-shaped conductive pillars 116 and the round-shaped conductive pillars 116 may reduce stress through stress re-distribution and may reduce defects in the subsequently completed device.

Figure 8:
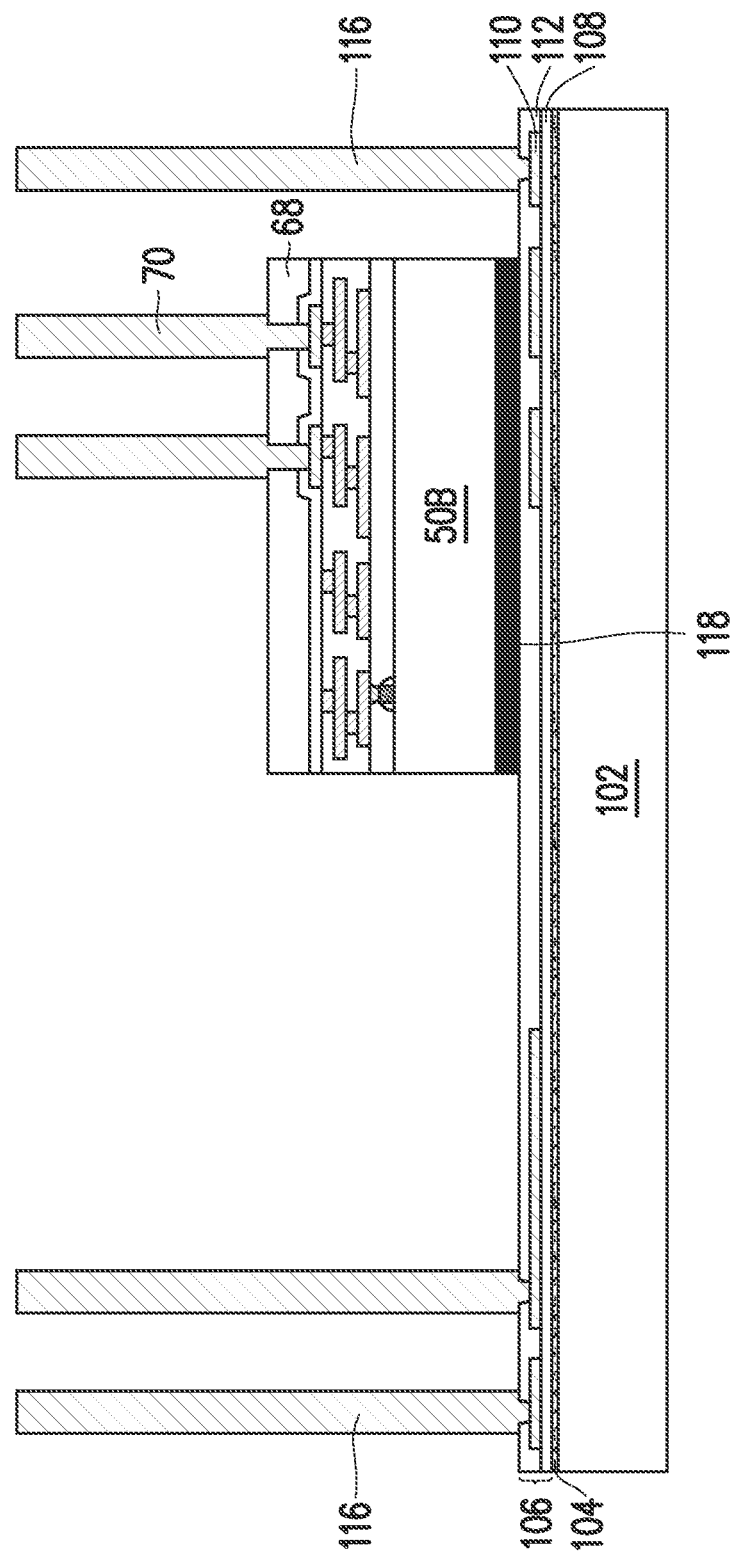

In FIG. 8, an active device die 50B is adhered to the dielectric layer 112 by an adhesive 118. The active device die 50B may be placed over the back-side redistribution structure using a pick and place machine or the like. The adhesive 118 is on back-sides of the active device die 50B and adheres the active device die 50B to the back-side redistribution structure 106, such as to the dielectric layer 112. The adhesive 118 may be any suitable adhesive, epoxy, die attach film (DAF), or the like. The adhesive 118 may be applied to back-sides of the active device die 50B or may be applied over the surface of the dielectric layer 112 on the carrier substrate 102. For example, the adhesive 118 may be applied to the back-side of the active device die 50B before the active device die 50B is singulated. As illustrated in FIG. 8, top surfaces of the conductive pillars 116 may be level with top surfaces of the conductive pillars 70 after the active device die 50B is attached to the back-side redistribution structure 106.

Figure 9:
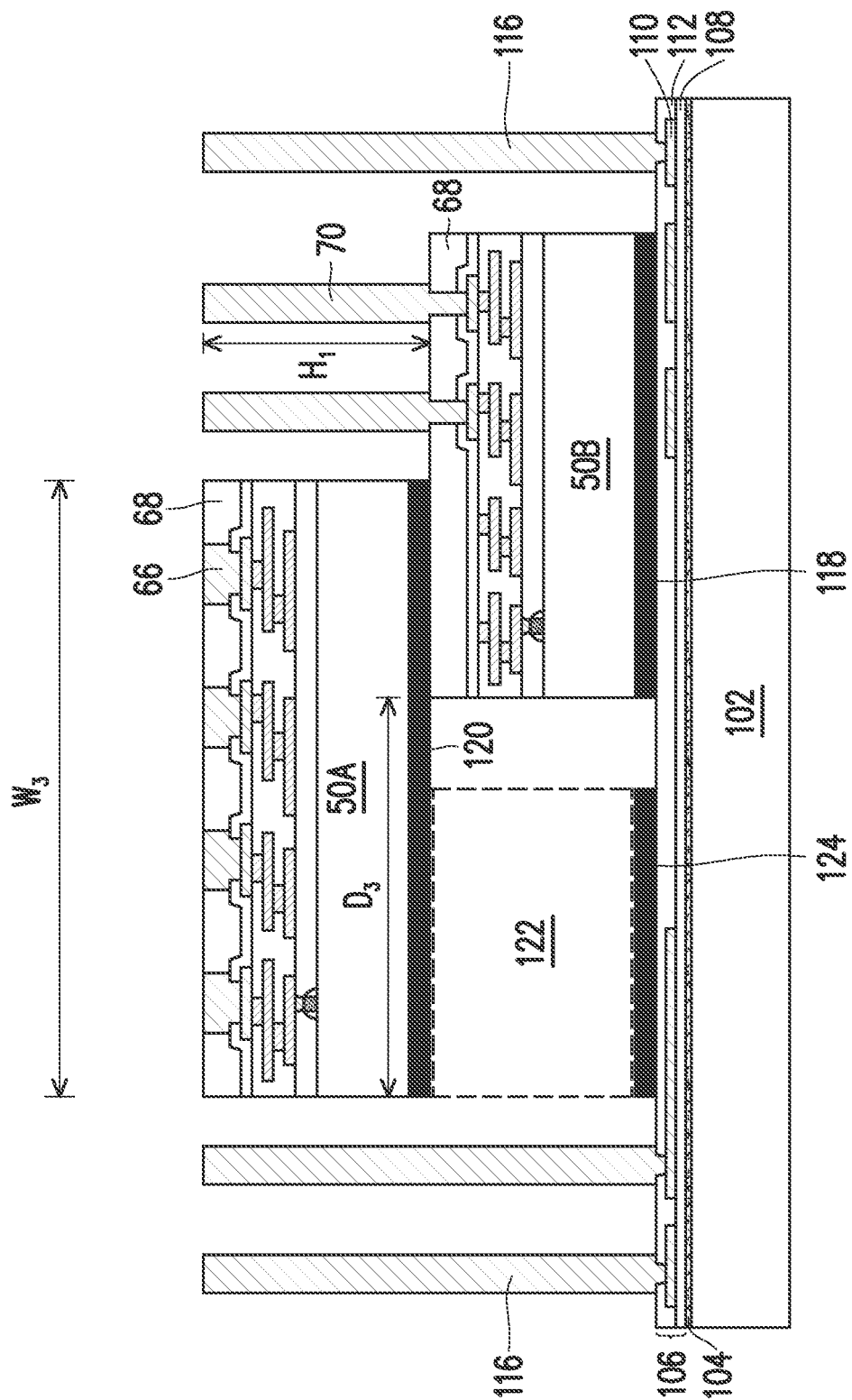

In FIG. 9, an active device die 50A is adhered to the active device die 50B by an adhesive 120. The active device die 50A may be placed over the active device die 50B using a pick and place machine or the like. The adhesive 120 is on back-sides of the active device die 50A and adheres the active device die 50A to the active device die 50B, such as to the dielectric layer 68. The adhesive 120 may be any suitable adhesive, epoxy, die attach film (DAF), or the like. The adhesive 120 may be applied to back-sides of the active device die 50A. For example, the adhesive 120 may be applied to the back-side of the active device die 50B before the active device die 50B is singulated. As illustrated in FIG. 9, in an embodiment, top surfaces of the active device die 50A, including top surfaces of the die connectors 66 and the dielectric layer 68, may be level with top surfaces of the conductive pillars 70 and the conductive pillars 116 after the active device die 50A is attached to the active device die 50B. In further embodiments, the top surfaces of the die connectors 66, the dielectric layer 68, the conductive pillars 70, and the conductive pillars 116 may not be level with one another after the active device die 50A is attached to the active device die 50B.

FIG. 9 further illustrates a dummy die 122 adhered to the dielectric layer 112 by an adhesive 124. The dummy die 122 is adhered to the back-side redistribution structure 106 before the active device die 50A is adhered to the active device die 50B and the dummy die 122. The dummy die 122 is optional and may or may not be included. For example, as illustrated in FIG. 9, the active device die 50A may be placed over the active device 50B such that at least a portion of the active device die 50A overhangs over the back-side redistribution structure 106, without the active device die 50B being interposed therebetween. The dummy die 122 may be included between the active device die 50A and the back-side redistribution structure 106 depending on the size of the active device die 50B, the size of the active device die 50A, the amount of the overhang, and the strength of the adhesive 120 in order to ensure that the active device die 50A is level and does not tilt. In some embodiments, the dummy die 122 may be included when a ratio of a width $W_3$ of the dummy die to a distance $D_3$ of the overhang is less than about ⅔ or less than about ½. In embodiments in which the dummy die 122 is included, the dummy die 122 is adhered to the back-side redistribution structure 106 before the active device die 50A is adhered to the active device die 50B and the dummy die 122.

The dummy die 122 may be placed over the back-side redistribution structure using a pick and place machine or the like. The adhesive 124 is on back-sides of the dummy die 122 and adheres the dummy die 122 to the back-side redistribution structure 106, such as to the dielectric layer 112. The adhesive 124 may be any suitable adhesive, epoxy, die attach film (DAF), or the like. The adhesive 124 may be applied to back-sides of the dummy die 122 or may be applied over the surface of the dielectric layer 112 on the carrier substrate 102. As illustrated in FIG. 8, top surfaces of the dummy die 122 may be level with top surfaces of the dielectric layer 68 of the active device die 50B after the dummy die 122 is attached to the back-side redistribution structure 106.

The dummy die 122 does not have electrical functions and is not electrically connected to the back-side redistribution structure 106, the active device die 50A, or the active device die 50B. The dummy die 122 may be formed of conductive materials, such as metals or metal alloys, semiconductor materials, dielectric materials, or the like. In some embodiments, the dummy die 122 may be formed of silicon, glass, quartz, copper, silicon carbide (SiC), or the like.

Figure 10:
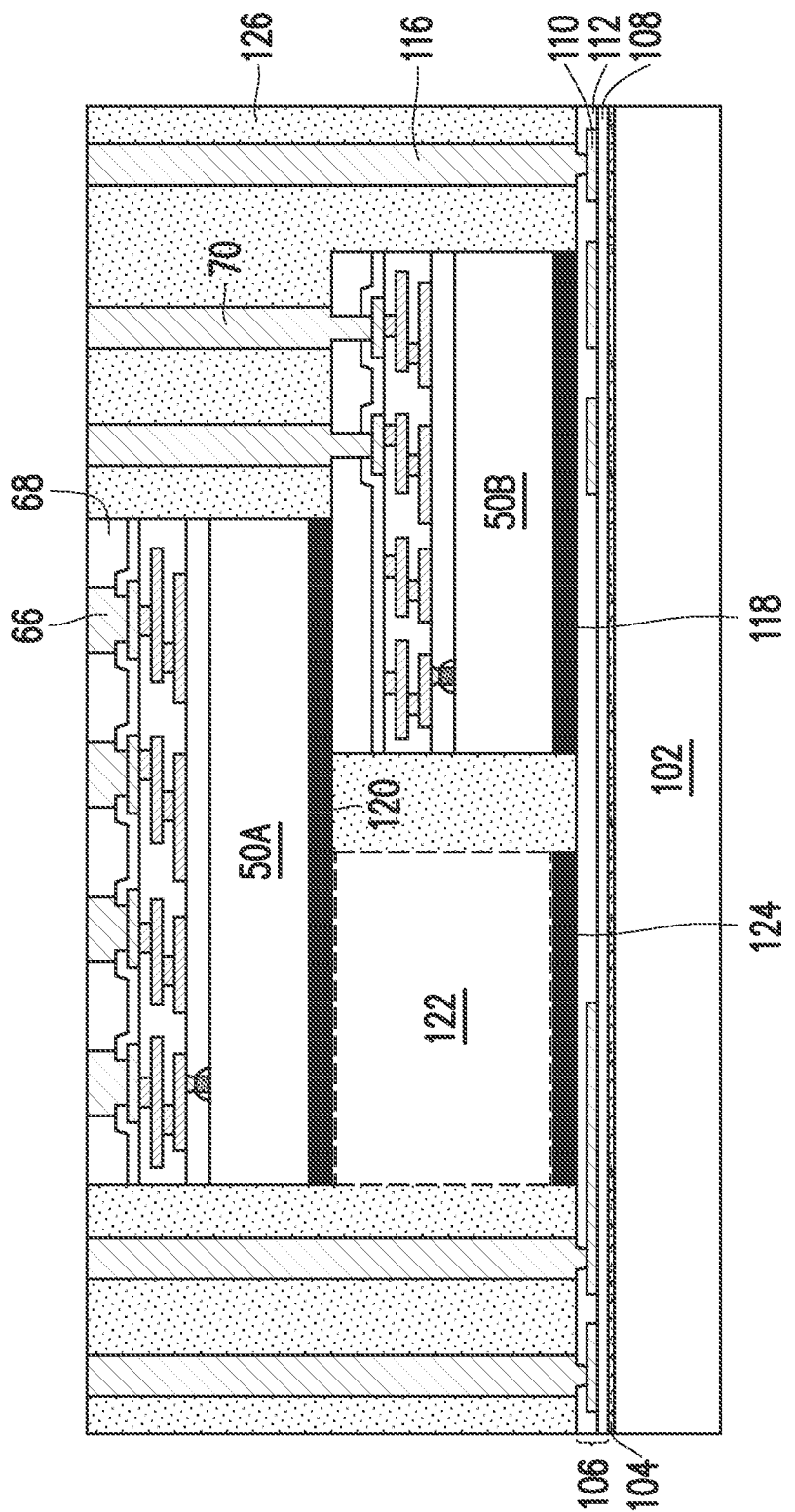

In FIG. 10, an encapsulant 126 is formed over the back-side redistribution structure 106 and surrounding the active device die 50A, the active device die 50B, the dummy die 122, and the conductive pillars 116. The encapsulant 126 may be a molding compound, epoxy, or the like. The encapsulant 126 may be applied by compression molding, transfer molding, or the like, and may be formed over the back-side redistribution structure 106 such that the active device die 50A, the active device die 50B, the dummy die 122, and the conductive pillars 116 are buried or covered. The encapsulant 126 may be applied in liquid or semi-liquid form and subsequently cured.

Further in FIG. 10, a planarization process is performed on the encapsulant 126 to expose the conductive pillars 116, the conductive pillars 70, the die connectors 66, and the dielectric layer 68. The planarization process may also remove material of the conductive pillars 116, the conductive pillars 70, the die connectors 66, and/or the dielectric layer 68. In some embodiments, top surfaces of the conductive pillars 116, the conductive pillars 70, the die connectors 66, and the dielectric layer 68 may not be level with one another prior to the planarization process and the planarization process may be utilized to level the top surfaces of the conductive pillars 116, the conductive pillars 70, the die connectors 66, and the dielectric layer 68 with one another. The planarization process may be, for example, a CMP process, a grinding process, an etch-back process, or the like. In some embodiments, the planarization process may be omitted, for example, if the conductive pillars 116, the conductive pillars 70, the die connectors 66, and the dielectric layer 68 are already exposed.

Figure 11:
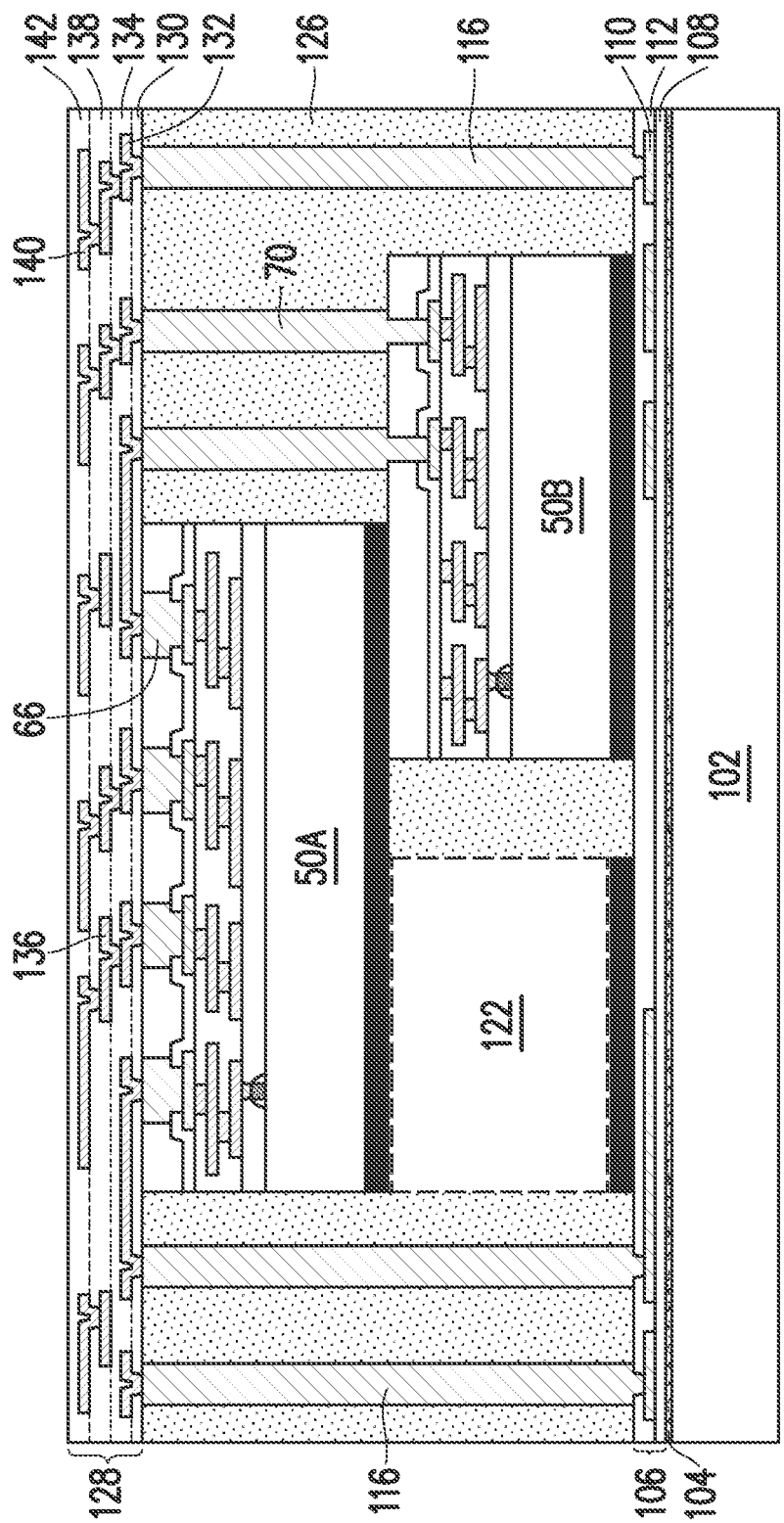

In FIG. 11, a front-side redistribution structure 128 is formed over the encapsulant 126, the conductive pillars 116, the conductive pillars 70, and the active device die 50A. The front-side redistribution structure 128 includes dielectric layers 130, 134, 138, and 142; and metallization patterns 132, 136, and 140. The metallization patterns may also be referred to as redistribution layers or redistribution lines. The front-side redistribution structure 128 illustrated in FIG. 11 includes three layers of metallization patterns and four layers of dielectric layers; however, more or fewer metallization patterns and dielectric layers may be included in the front-side redistribution structure 128. If fewer dielectric layers and metallization patterns are to be formed, steps and process discussed below may be omitted. If more dielectric layers and metallization patterns are to be formed, steps and processes discussed below may be repeated.

The dielectric layer 130 is deposited on the encapsulant 126, the conductive pillars 116, the conductive pillars 70, and the active device die 50A. In some embodiments, the dielectric layer 130 is formed of a photo-sensitive material such as PBO, polyimide, BCB, or the like, which may be patterned using a lithography mask. The dielectric layer 130 may be formed by spin coating, lamination, CVD, the like, or a combination thereof. The dielectric layer 130 is then patterned. The patterning forms openings exposing portions of the conductive pillars 116, the conductive pillars 70, and the die connectors 66. The patterning may be by an acceptable process, such as by exposing the dielectric layer 130 to light when the dielectric layer 130 is a photo-sensitive material or by etching using, for example, an anisotropic etch. If the dielectric layer 130 is a photo-sensitive material, the dielectric layer 130 may be developed after the exposure.

The metallization pattern 132 is then formed. The metallization pattern 132 includes line portions (also referred to as conductive lines) on and extending along the major surface of the dielectric layer 130. The metallization pattern 132 further includes via portions (also referred to as conductive vias) extending through the dielectric layer 130 to physically and electrically couple the conductive pillars 116, the conductive pillars 70 of the active device die 50B, and the die connectors 66 of the active device die 50A. As an example, the metallization pattern 132 may be formed by first forming a seed layer over the dielectric layer 130 and in the openings extending through the dielectric layer 130. In some embodiments, the seed layer is a metal layer, which may be a single layer or a composite layer comprising a plurality of sublayers formed of different materials. In some embodiments, the seed layer comprises a titanium layer and a copper layer over the titanium layer. The seed layer may be formed using, for example, PVD or the like. A photoresist is then formed and patterned on the seed layer. The photoresist may be formed by spin coating or the like and may be exposed to light for patterning. The pattern of the photoresist corresponds to the metallization pattern 132. The patterning forms openings through the photoresist to expose the seed layer. A conductive material is then formed in the openings of the photoresist and on the exposed portions of the seed layer. The conductive material may be formed by plating, such as electroplating or electroless plating, or the like. The conductive material may comprise a metal, like copper, titanium, tungsten, aluminum, or the like. The combination of the conductive material and underlying portions of the seed layer form the metallization pattern 132. The photoresist and portions of the seed layer on which the conductive material is not formed are removed. The photoresist may be removed by an acceptable ashing or stripping process, such as using an oxygen plasma or the like. Once the photoresist is removed, exposed portions of the seed layer are removed using an acceptable etching process, such as wet or dry etching.

The dielectric layer 134 is deposited on the metallization pattern 132 and the dielectric layer 130. The dielectric layer 134 may be formed in a manner similar to the dielectric layer 130, and may be formed of a material similar to the material of the dielectric layer 130.

The metallization pattern 136 is then formed. The metallization pattern 136 includes line portions on and extending along the major surface of the dielectric layer 134. The metallization pattern 136 further includes via portions extending through the dielectric layer 134 to physically and electrically couple the metallization pattern 132. The metallization pattern 136 may be formed in a manner similar to the metallization pattern 132, and may be formed of a material similar to the material of the metallization pattern 132.

The dielectric layer 138 is deposited on the metallization pattern 136 and the dielectric layer 134. The dielectric layer 138 may be formed in a manner similar to the dielectric layer 130, and may be formed of a material similar to the material of the dielectric layer 130.

The metallization pattern 140 is then formed. The metallization pattern 140 includes line portions on and extending along the major surface of the dielectric layer 138. The metallization pattern 140 further includes via portions extending through the dielectric layer 138 to physically and electrically couple the metallization pattern 136. The metallization pattern 140 may be formed in a manner similar to the metallization pattern 132, and may be formed of a material similar to the material of the metallization pattern 132. The metallization pattern 140 is the topmost metallization pattern of the front-side redistribution structure 128. As such, all of the intermediate metallization patterns of the front-side redistribution structure 128 (e.g., the metallization patterns 132 and 136) are disposed between the metallization pattern 140 and the encapsulant 126, the conductive pillars 116, the conductive pillars 70 of the active device die 50B, and the die connectors 66 of the active device die 50A.

The dielectric layer 142 is deposited on the metallization pattern 140 and the dielectric layer 138. The dielectric layer 142 may be formed in a manner similar to the dielectric layer 130, and may be formed of a material similar to the material of the dielectric layer 130. The dielectric layer 142 is the topmost dielectric layer of the front-side redistribution structure 128. As such, all of the metallization patterns of the front-side redistribution structure 128 (e.g., the metallization patterns 132, 136, and 140) are disposed between the dielectric layer 142 and the encapsulant 126, the conductive pillars 116, the conductive pillars 70 of the active device die 50B, and the die connectors 66 of the active device die 50A. Further, all of the intermediate dielectric layers of the front-side redistribution structure 128 (e.g., the dielectric layers 130, 134, and 138) are disposed between the dielectric layer 142 and the encapsulant 126, the conductive pillars 116, the conductive pillars 70 of the active device die 50B, and the die connectors 66 of the active device die 50A.

Figure 12:
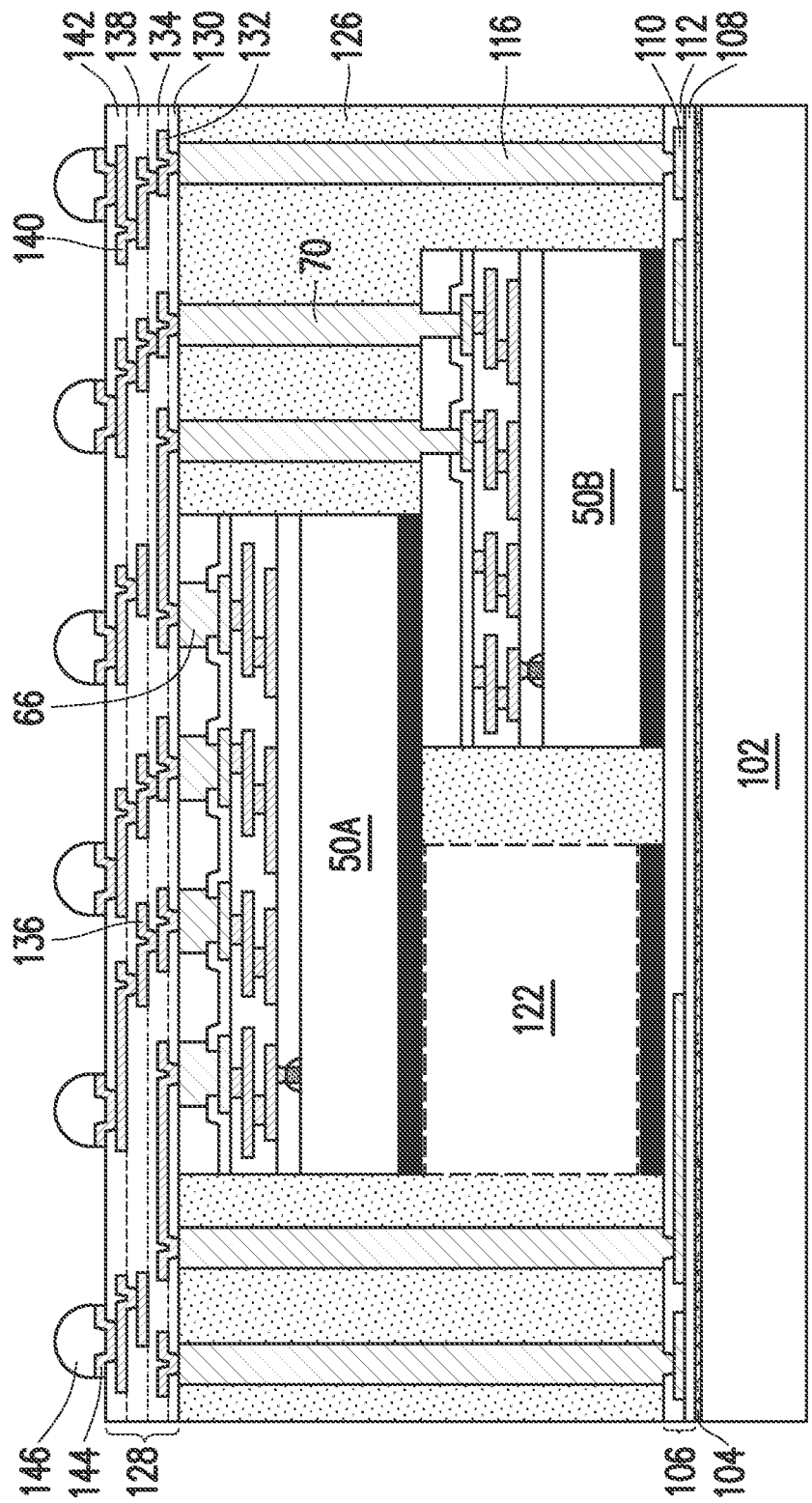

In FIG. 12, UBMs 144 are formed for external connection to the front-side redistribution structure 128. The UBMs 144 have bump portions on and extending along a major surface of the dielectric layer 142, and have via portions extending through the dielectric layer 142 to physically and electrically couple to the metallization pattern 140. As a result, the UBMs 144 are electrically coupled to the conductive pillars 116, the active device die 50A, and the active device die 50B. The UBMs 144 may be formed of the same material as the metallization pattern 132. In some embodiments, the UBMs 144 may have different sizes from the metallization patterns 132, 136, and 140.

Further in FIG. 12, conductive connectors 146 are formed on the UBMs 144. The conductive connectors 146 may be ball grid array (BGA) connectors, solder balls, metal pillars, controlled collapse chip connection (C4) bumps, micro bumps, electroless nickel-electroless palladium-immersion gold technique (ENEPIG) formed bumps, or the like. The conductive connectors 146 may include a conductive material such as solder, copper, aluminum, gold, nickel, silver, palladium, tin, the like, or a combination thereof. In some embodiments, the conductive connectors 146 are formed by initially forming a layer of solder through evaporation, electroplating, printing, solder transfer, ball placement, or the like. Once a layer of solder has been formed on the structure, a reflow may be performed in order to shape the material into the desired bump shapes. In another embodiment, the conductive connectors 146 comprise metal pillars (such as a copper pillar) formed by a sputtering, printing, electro plating, electroless plating, CVD, or the like. The metal pillars may be solder free and have substantially vertical sidewalls. In some embodiments, a metal cap layer is formed on the top of the metal pillars. The metal cap layer may include nickel, tin, tin-lead, gold, silver, palladium, indium, nickel-palladium-gold, nickel-gold, the like, or a combination thereof and may be formed by a plating process.

Figure 13:
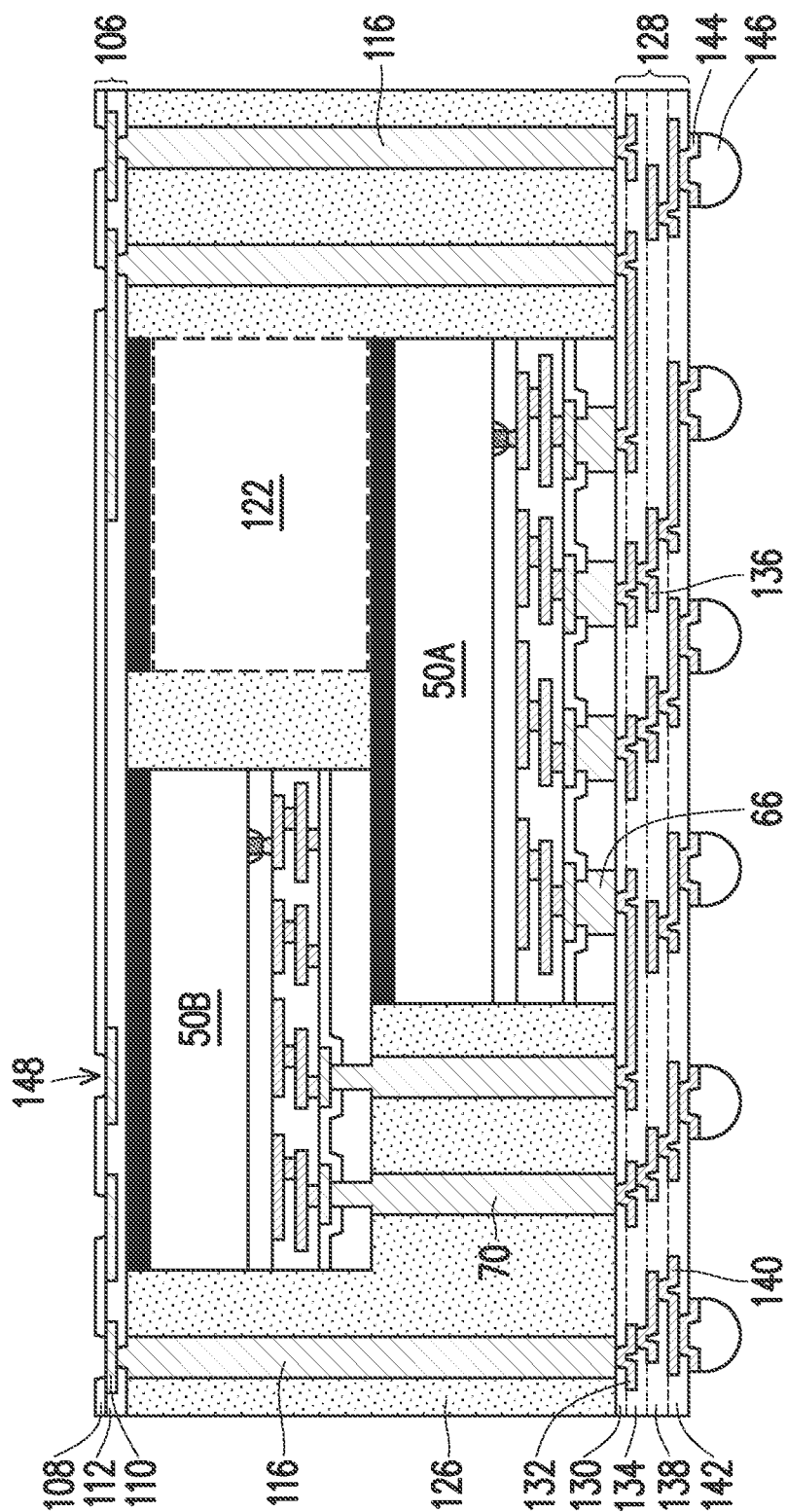

In FIG. 13, the structure of FIG. 12 is flipped, the carrier substrate 102 is de-bonded from the back-side redistribution structure 106, e.g., the dielectric layer 108, and openings 148 are formed in the dielectric layer 108. In accordance with some embodiments, the de-bonding includes projecting a light such as a laser light or a UV light on the release layer 104 so that the release layer 104 decomposes under the heat of the light and the carrier substrate 102 can be removed. The structure is then flipped over. In some embodiments, the structure may be placed on a tape (not separately illustrated). The openings 148 are formed through the dielectric layer 108 to expose portions of the metallization pattern 110. The openings 148 may be formed, for example, using laser drilling, etching, or the like.

Figure 14:
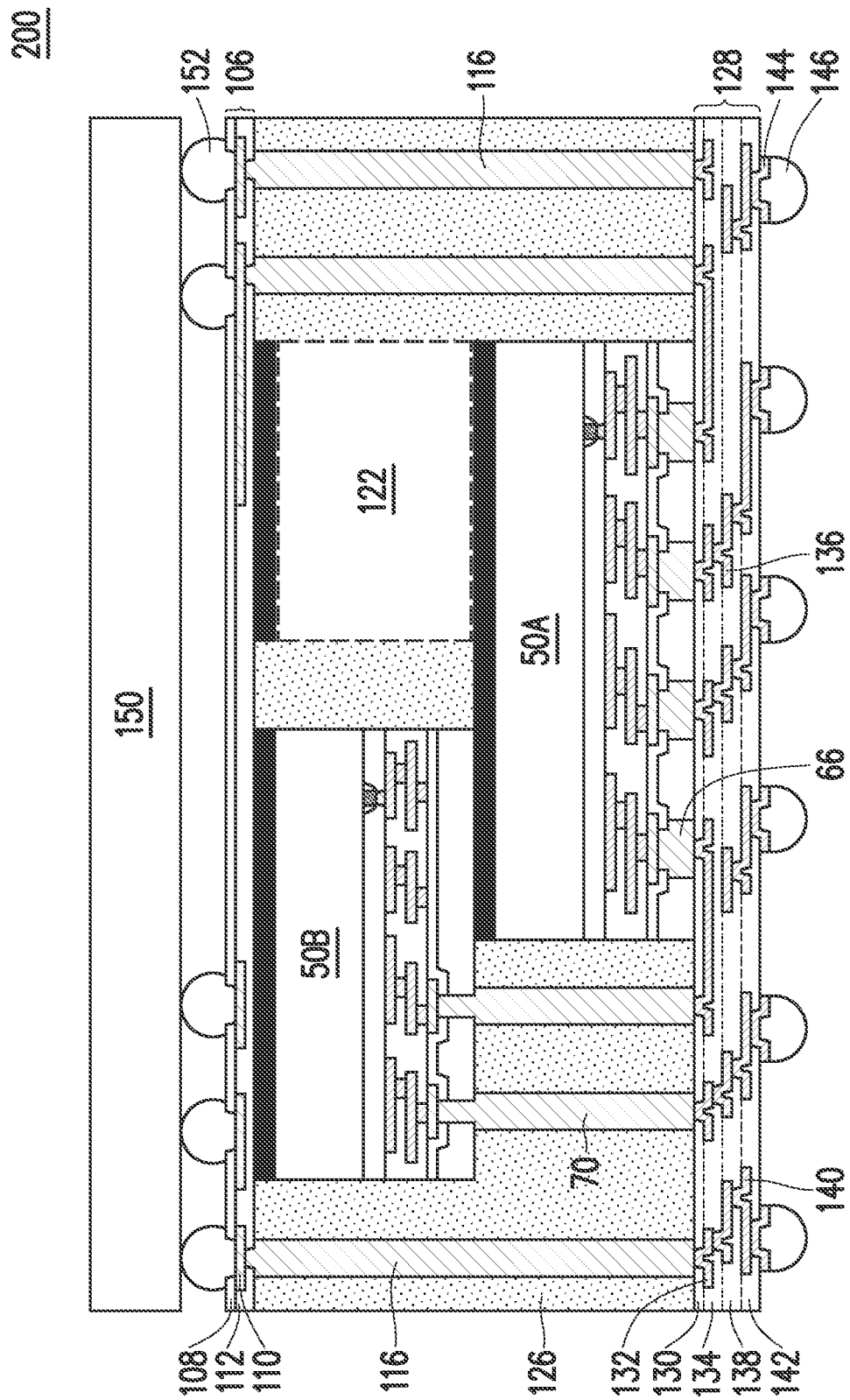

In FIG. 14, a package component 150 is bonded to the back-side redistribution structure 106 to form a packaged semiconductor device 200. In some embodiments, the package component 150 may be a memory die (e.g., a dynamic random access memory (DRAM) die, a low-power double data rate synchronous dynamic random access memory (LPDDR) die, a static random access memory (SRAM) die, a high bandwidth memory (HBM) die, or the like). In other embodiments, the package component 150 may be a logic die (e.g., central processing unit (CPU), a graphics processing unit (GPU), a system-on-a-chip (SoC), an application processor (AP), a microcontroller, or the like), an input/output (I/O) interface die, a power management die (e.g., a power management integrated circuit (PMIC) die or the like), a radio frequency (RF) die, a sensor die, a micro-electro-mechanical-system (MEMS) die, a signal processing die (e.g., a digital signal processing (DSP) die or the like), a front-end die (e.g., an analog front-end (AFE) die or the like), the like, or combinations thereof.

The package component 150 may be bonded to the back-side redistribution structure 106 using conductive connectors 152. The conductive connectors 152 may be formed in the openings 148, may be provided on the package component 150, or a combination thereof. The conductive connectors 152 may be ball grid array (BGA) connectors, solder balls, metal pillars, controlled collapse chip connection (C4) bumps, micro bumps, electroless nickel-electroless palladium-immersion gold technique (ENEPIG) formed bumps, or the like. The conductive connectors 152 may include a conductive material such as solder, copper, aluminum, gold, nickel, silver, palladium, tin, the like, or a combination thereof. In some embodiments, the conductive connectors 152 are formed by initially forming a layer of solder through methods such as evaporation, electroplating, printing, solder transfer, ball placement, or the like. Once a layer of solder has been formed on the structure, a reflow may be performed in order to shape the material into the desired bump shapes. The package component 150 may be placed over the back-side redistribution structure 106 using a pick and place machine or the like. Once the package component 150 is placed, the conductive connectors 152 may be reflowed to bond the package component 150 to the back-side redistribution structure 106.

By forming the conductive pillars 70 in the active device 50B, the active device 50B and the active device 50A can be attached to the back-side redistribution structure 106 at two levels, requiring a footprint. Moreover, only a single molding and grinding step is required to form the encapsulant 126 encapsulating the active device 50B and the active device 50A. Including the back-side redistribution structure 106 and the front-side redistribution structure 128 in the packaged semiconductor device 200 allows for the active device die 50B (e.g., a WIO memory die) and the package component 150 (e.g., an LPDDR die or a DRAM die) with different input/output pad locations to be integrated with the active device die 50A (e.g., an SoC), thus offering flexibility in the choice of dies used for integration in the packaged semiconductor device 200. Copper-to-copper interfaces between the conductive pillars 116 and the back-side redistribution structure 106 and the front-side redistribution structure 128 reduce the resistance of the conductive pillars 116, reducing the RC delay of the packaged semiconductor device 200 and improving signal integrity. Moreover, including oval-shaped and circular-shaped conductive pillars 1156 and 70 reduces stress in the packaged semiconductor device 300.

Figure 15:
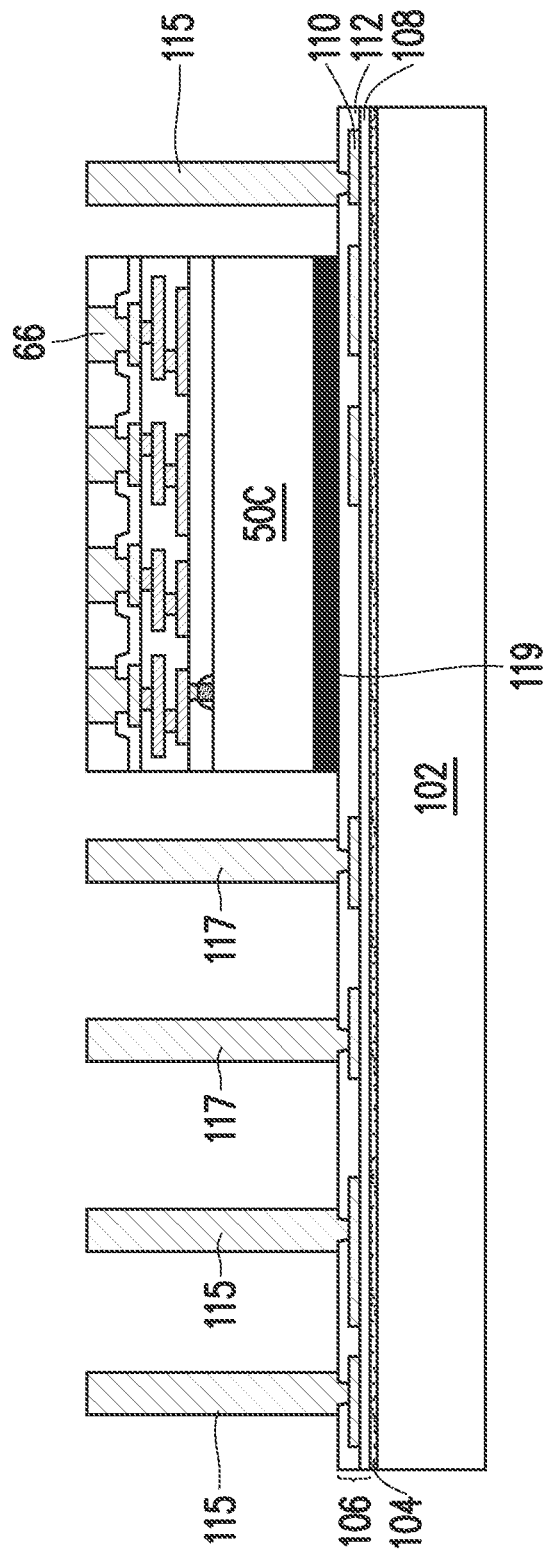
FIGS. 15-20 illustrate cross-sectional views of intermediate steps during a process for forming a packaged semiconductor device, in accordance with some embodiments.

FIGS. 15-20 are cross-sectional views of intermediate stages in the manufacturing of a packaged semiconductor device 300, in accordance with some embodiments. Reference numerals used in FIGS. 15-20 which are the same as reference numerals used in FIGS. 1-14 indicate the same or similar layers and/or structures formed using like processes. As such, layers and structures having the same reference numerals may be formed using the same or similar materials and methods as those discussed above with reference to FIGS. 1-14 and will not be repeated. In FIG. 15, a carrier substrate 102 is provided, a release layer 104 is formed on the carrier substrate 102, and a back-side redistribution structure 106 is formed on the release layer 104. Conductive pillars 115 and conductive pillars 117 are formed extending above a topmost dielectric layer of the back-side redistribution structure 106 (e.g., the dielectric layer 112 in the embodiment illustrated in FIG. 15) and through the dielectric layer 112 to contact the metallization pattern 110. The conductive pillars 115 and the conductive pillars 117 may be formed in a manner similar to the conductive pillars 116, and may be formed of a material similar to the material of the conductive pillars 116.

An active device die 50C is attached to the back-side redistribution structure 106 though an adhesive 119. The active device die 50C may be formed in a manner similar to the active device die 50A, and may be formed of a material similar to the material of the active device die 50A. In some embodiments, the active device die 50C may have a size different from that of the active device die 50A. The active device die 50C may have a length from about 9 mm to about 12 mm and a width from about 7 mm to about 12 mm in a top-down view. In an embodiment, the active device die 50C may be a WIO memory die. The adhesive 119 may be formed in a manner similar to the adhesive 118, and may be formed of a material similar to the material of the adhesive 118.

Figure 20:
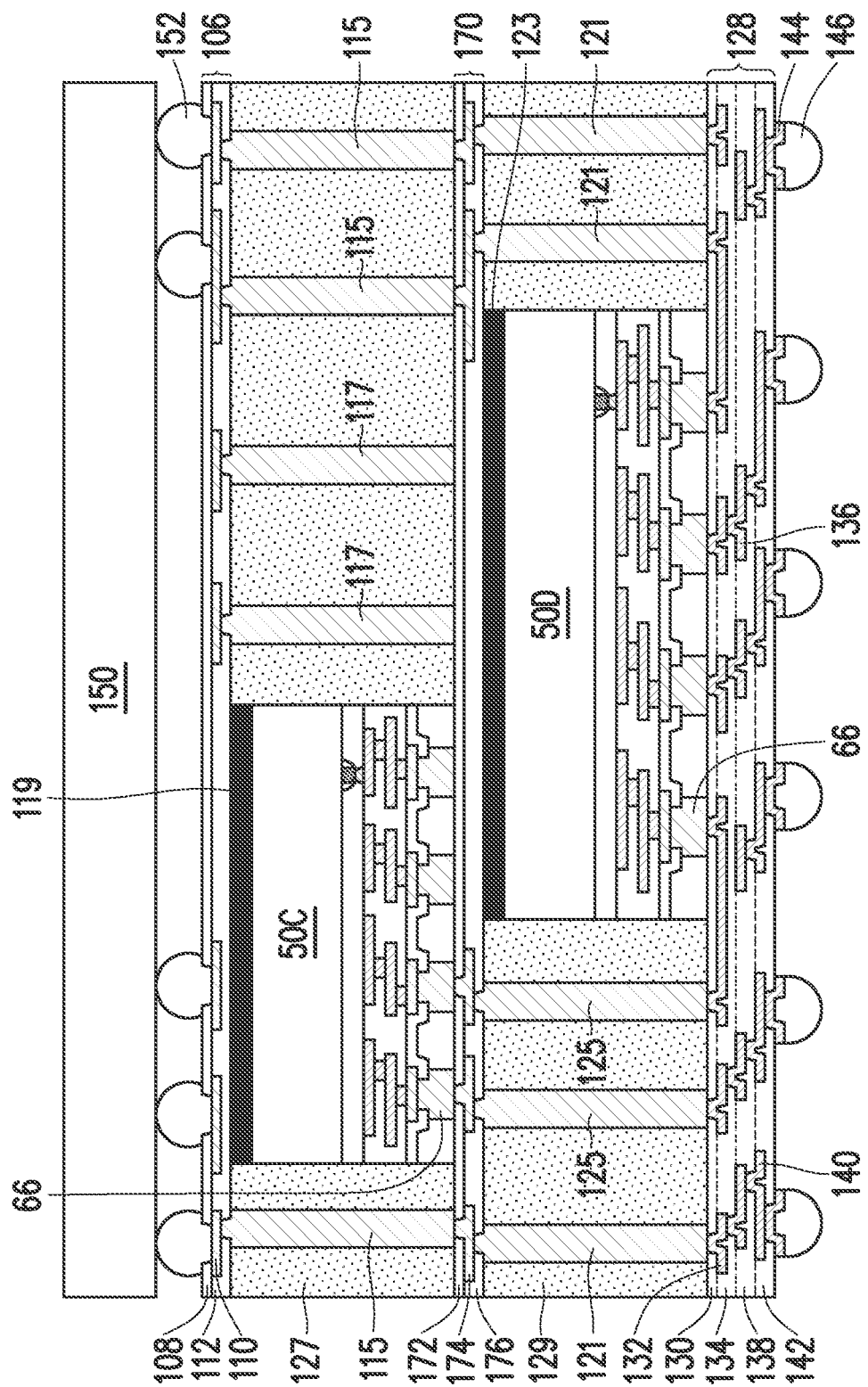

In some embodiments, the conductive pillars 115 may provide electrical coupling between the active device 50C and each of an active device (e.g., the active device 50D, illustrated in FIG. 18A) and a package component (e.g., the package component 150, illustrated in FIG. 20). The conductive pillars 117 may provide thermal dissipation and may or may not be electrically coupled to any of the active device 50C, the active device 50D, and the package component 150. The conductive pillars 115 and/or the conductive pillars 117 may have circular cross-sectional shapes or oval cross-sectional shapes. Other cross-sectional shapes, such as square, rectangular, polygonal, or the like may also be possible. In embodiments in which the conductive pillars 115 and/or the conductive pillars 117 have circular cross-sectional shapes, the conductive pillars 115 and/or the conductive pillars 117 may have diameters from about 20 μm to about 150 μm, such as about 30 μm or about 90 μm. In embodiments in which the conductive pillars 115 and/or the conductive pillars 117 have oval cross-sectional shapes, a length of the conductive pillars 115 and/or the conductive pillars 117 in a top-down view may be from about 40 μm to about 160 μm, such as about 60 μm and a width of the conductive pillars 115 and/or the conductive pillars 117 in the top-down view may be from about 30 μm to about 150 μm, such as about 30 μm. The conductive pillars 115 may have a pitch from about 80 μm to about 250 μm, such as about 150 μm. The conductive pillars 117 may have a pitch from about 80 μm to about 250 μm, such as about 150 μm.

Figure 16:
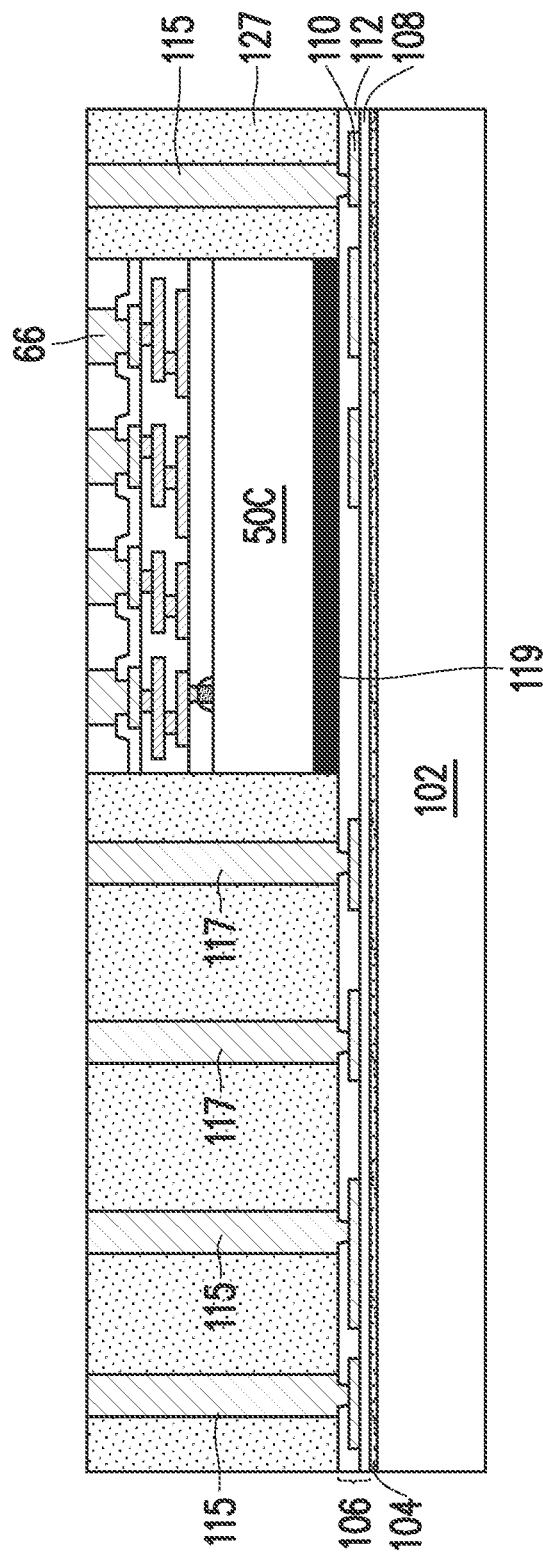

In FIG. 16, an encapsulant 127 is formed over the back-side redistribution structure 106 and surrounding the active device die 50C, the conductive pillars 115, and the conductive pillars 117. The encapsulant 127 may be formed in a manner similar to the encapsulant 126, and may be formed of a material similar to the material of the encapsulant 126. The encapsulant 127 may be planarized to expose the conductive pillars 115, the conductive pillars 117, and die connectors 66 of the active device die 50C. The planarization process may also remove material of the die connectors 66, a dielectric layer 68 of the active device die 50C, the conductive pillars 115, and/or the conductive pillars 117. The planarization process may be, for example, a CMP process, a grinding process, an etch-back process, or the like. In some embodiments, the planarization process may be omitted, for example, if the conductive pillars 115, the conductive pillars 117, and the die connectors 66 are already exposed.

Figure 17:
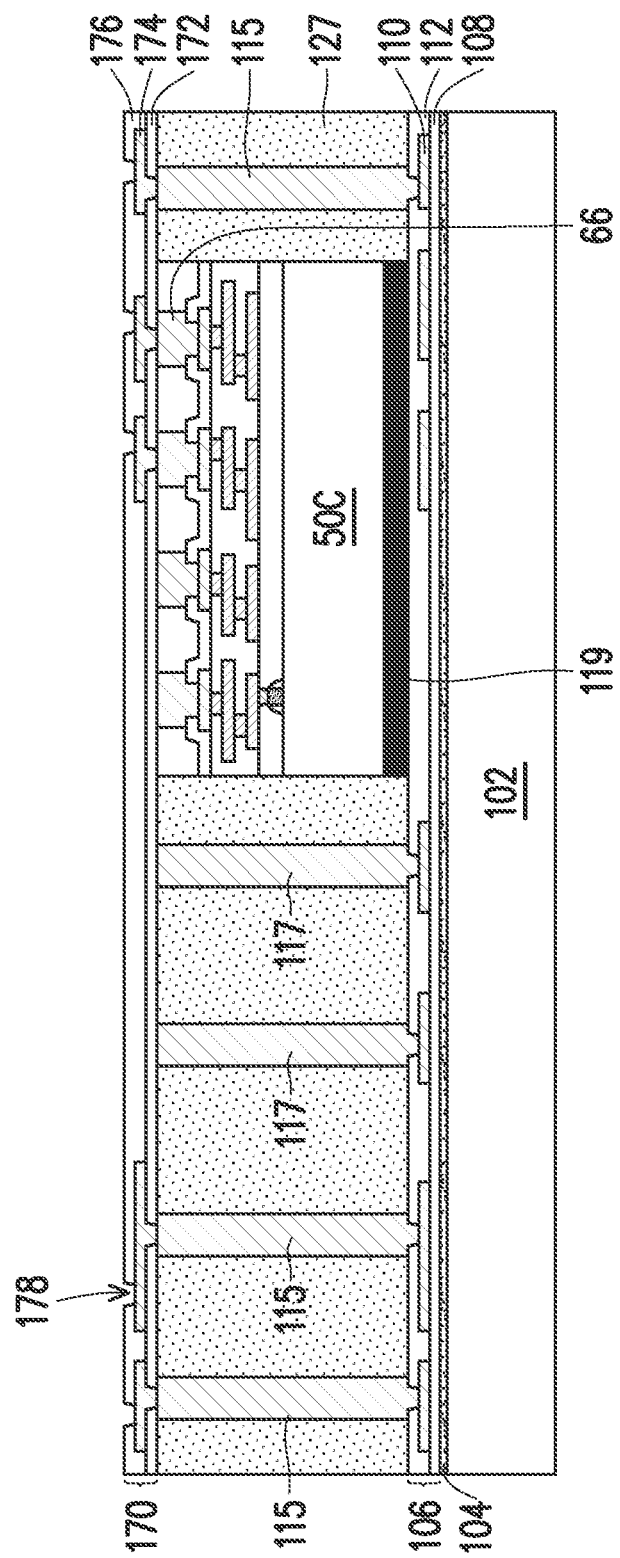

In FIG. 17, an intermediate redistribution structure 170 is formed over the encapsulant 127, the conductive pillars 115, the conductive pillars 117, and the active device die 50C. The intermediate redistribution structure 170 includes dielectric layers 172 and 176; and metallization pattern 174. The metallization pattern may also be referred to as a redistribution layer or a redistribution line. The intermediate redistribution structure 170 illustrated in FIG. 17 includes one layer of metallization pattern and two layers of dielectric layers; however, more or fewer metallization patterns and dielectric layers may be included in the intermediate redistribution structure 170. If fewer dielectric layers and metallization patterns are to be formed, steps and process discussed below may be omitted. If more dielectric layers and metallization patterns are to be formed, steps and processes discussed below may be repeated.

The dielectric layer 172 is deposited on the encapsulant 127, the conductive pillars 115, the conductive pillars 117, and the active device die 50C. The dielectric layer 172 may be formed in a manner similar to the dielectric layer 130, and may be formed of a material similar to the material of the dielectric layer 130.

The metallization pattern 174 is then formed. The metallization pattern 174 includes line portions on and extending along the major surface of the dielectric layer 172. The metallization pattern 174 further includes via portions extending through the dielectric layer 172 to physically and electrically couple the conductive pillars 115, the conductive pillars 117, and the die connectors 66. The metallization pattern 174 may be formed in a manner similar to the metallization pattern 132, and may be formed of a material similar to the material of the metallization pattern 132.

The dielectric layer 176 is deposited on the metallization pattern 174 and the dielectric layer 172. The dielectric layer 176 may be formed in a manner similar to the dielectric layer 130, and may be formed of a material similar to the material of the dielectric layer 130. Openings 178 may be formed through the dielectric layer 176 to expose portions of the metallization pattern 174. The openings 178 may be formed, for example, using laser drilling, etching, or the like.

Figure 18A:
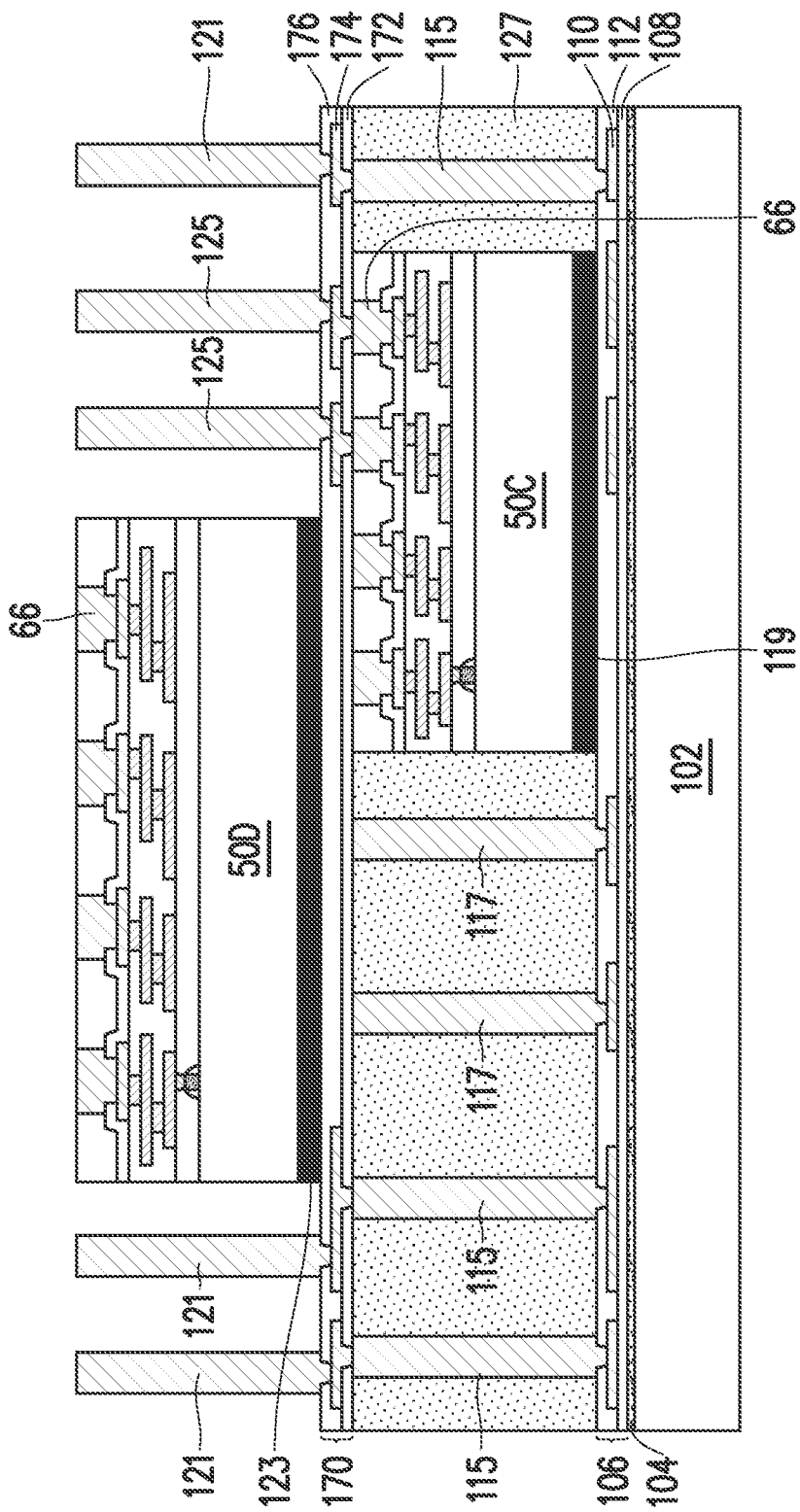

In FIG. 18A, conductive pillars 121 and conductive pillars 125 are formed extending above a topmost dielectric layer of the intermediate redistribution structure 170 (e.g., the dielectric layer 176 in the embodiment illustrated in FIG. 17) and through the dielectric layer 176 to contact the metallization pattern 174. The conductive pillars 121 and the conductive pillars 125 may be formed in a manner similar to the conductive pillars 116, and may be formed of a material similar to the material of the conductive pillars 116.

An active device die 50D is attached to the intermediate redistribution structure 170 though an adhesive 123. The active device die 50D may be formed in a manner similar to the active device die 50A, and may be formed of a material similar to the material of the active device die 50A. In some embodiments, the active device die 50D may have a size different from that of the active device die 50C. The active device die 50D may have a length from about 9 mm to about 12 mm and a width from about 7 mm to about 12 mm in a top-down view. In an embodiment, the active device die 50D may be an SoC. The adhesive 123 may be formed in a manner similar to the adhesive 118, and may be formed of a material similar to the material of the adhesive 118.

Figure 18B:
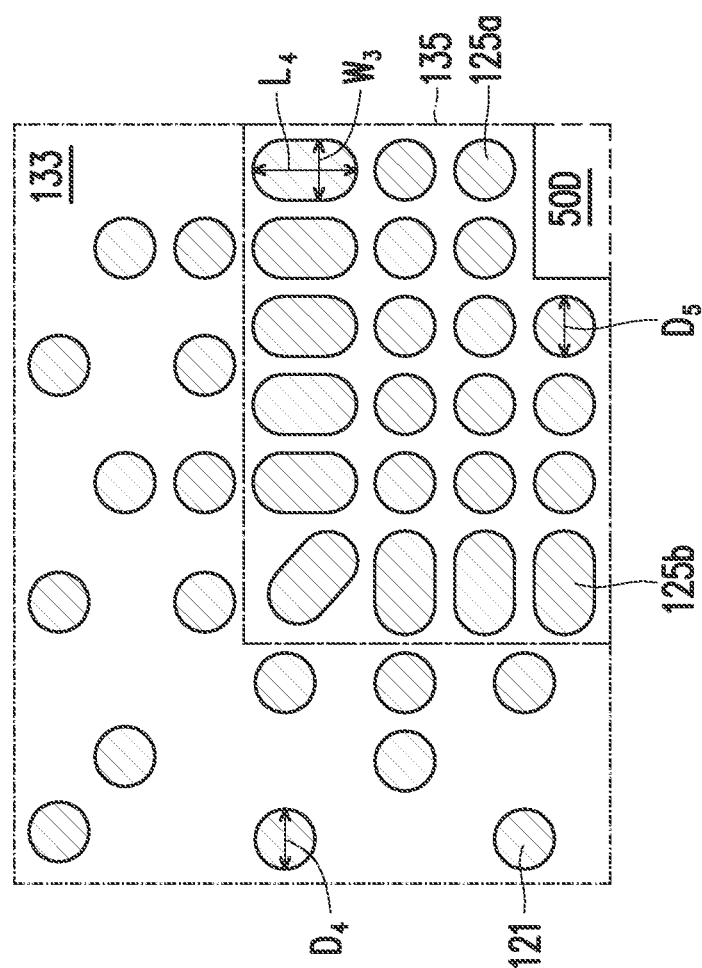

FIG. 18B illustrates a cross-sectional view of a portion of the structure of FIG. 18A including conductive pillars 121 in a first region 133, conductive pillars 125 in a second region 135, and active device die 50D. The pattern of the conductive pillars 121 in the first region 133 and the conductive pillars 125 in the second region may continue such that the conductive pillars 121 in the first region 133 encircle the second region 135 and the conductive pillars 125 in the second region 135 encircle the active device die 50D in a top-down view. A distribution of the conductive pillars 125 per unit area in the second region 135 may be greater than a distribution of the conductive pillars 121 per unit area in the first region 133. For example, a distribution of the conductive pillars 121 per unit area in the first region 133 may be from about 20 pillars/mm$^2$ to about 80 pillars/mm$^2$, such as about 49 pillars/mm$^2$, while a distribution of the conductive pillars 125 per unit area in the second region 135 may be from about 200 pillars/mm$^2$ to about 800 pillars/mm$^2$, such as about 625 pillars/mm$^2$. As illustrated in FIG. 18B, the conductive pillars 121 in the first region 133 may have circular cross-sectional shapes and the second region 135 may include conductive pillars 125a having circular cross-sectional shapes as well as conductive pillars 125b having oval cross-sectional shapes. The pattern of the conductive pillars 125a and the conductive pillars 125b may continue such that the conductive pillars 125b having oval cross-sectional shapes encircle the conductive pillars 125a having circular cross-sectional shapes in the top-down view. The conductive pillars 121 may have diameters $D_4$ from about 50 µm to about 120 µm, such as about 90 µm. In another embodiment, the conductive pillars 121 have diameters $D_4$ from about 25 µm to about 35 µm. The conductive pillars 125a may have diameters $D_5$ from about 20 µm to about 50 µm, such as about 30 µm. A length $L_4$ of the conductive pillars 125b in the top-down view may be from about 35 µm to about 55 µm, such as about 45 µm and a width $W_3$ of the conductive pillars 125b in the top-down view may be from about 20 µm to about 35 µm, such as about 25 µm. In another embodiment, the conductive pillars 125b may have lengths $L_4$ from about 25 µm to about 50 µm and widths $W_3$ from about 25 µm to about 37 µm.

The conductive pillars 121 in the first region 133 may be included to provide interconnections between a subsequently bonded package component (e.g., the package component 150 illustrated in FIG. 20) and the active device die 50D through the intermediate redistribution structure 170 and the front-side redistribution structure 128. The conductive pillars 125 in the second region may be included to provide interconnections between the active device die 50C and the active device die 50D through the intermediate redistribution structure 170 and the front-side redistribution structure 128. The distributions, shapes, and sizes of the conductive pillars 121 in the first region 133 and the conductive pillars 125 in the second region 135 may be selected based on the types of signals (e.g., power signals, data signals, or the like) to be sent between the package component 150 and the active device die 50D and between the active device die 50C and the active device die 50D, respectively. Including both the oval-shaped conductive pillars 125b and the circular-shaped conductive pillars 125a may enlarge the process window for forming devices, requiring less control, which simplifies processing and increases device throughput. Including both the oval-shaped conductive pillars 125*b* and the circular-shaped conductive pillars 125*a* may also reduce stress in the completed devices.

Figure 19:
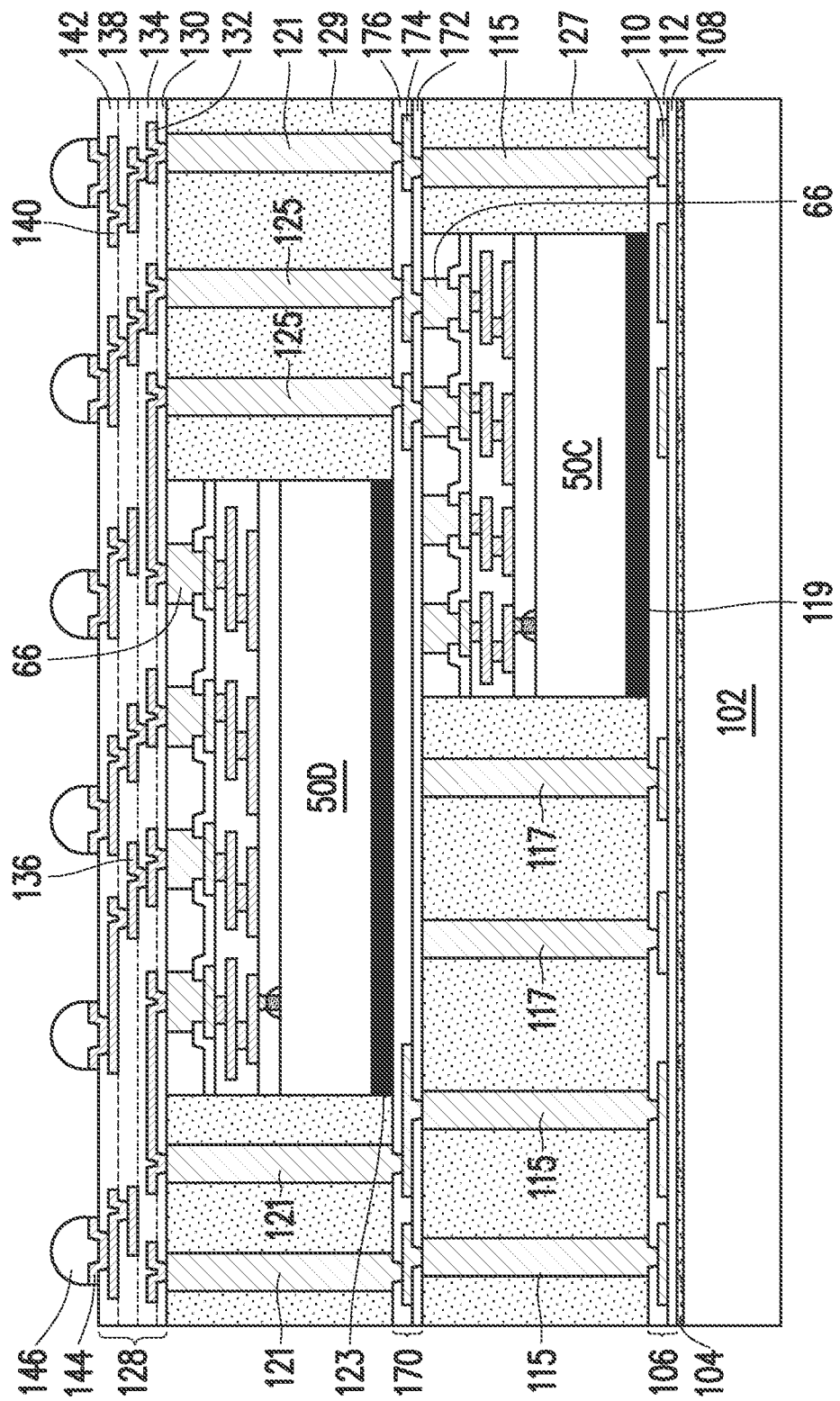

In FIG. 19, an encapsulant 129 is formed over the intermediate redistribution structure 170 and surrounding the active device die 50D, the conductive pillars 121, and the conductive pillars 125. The encapsulant 129 may be formed in a manner similar to the encapsulant 126, and may be formed of a material similar to the material of the encapsulant 126. The encapsulant 129 may be planarized to expose the conductive pillars 121, the conductive pillars 125, and die connectors 66 of the active device die 50D. The planarization process may also remove material of the die connectors 66, a dielectric layer 68 of the active device die 50D, the conductive pillars 121, and/or the conductive pillars 125. The planarization process may be, for example, a CMP process, a grinding process, an etch-back process, or the like. In some embodiments, the planarization process may be omitted, for example, if the conductive pillars 121, the conductive pillars 125, and the die connectors 66 are already exposed.

Further in FIG. 19, a front-side redistribution structure 128 is formed over the encapsulant 129, the conductive pillars 121, the conductive pillars 125, and the active device die 50D. The front-side redistribution structure 128 includes dielectric layers 130, 134, 138, and 142; and metallization patterns 132, 136, and 140. The metallization patterns may also be referred to as redistribution layers or redistribution lines. The front-side redistribution structure 128 illustrated in FIG. 19 includes three layers of metallization patterns and four layers of dielectric layers; however, more or fewer metallization patterns and dielectric layers may be included in the front-side redistribution structure 128. If fewer dielectric layers and metallization patterns are to be formed, steps and process discussed above may be omitted. If more dielectric layers and metallization patterns are to be formed, steps and processes discussed above may be repeated.

UBMs 144 are formed for external connection to the front-side redistribution structure 128. The UBMs 144 have bump portions on and extending along a major surface of the dielectric layer 142, and have via portions extending through the dielectric layer 142 to physically and electrically couple to the metallization pattern 140. As a result, the UBMs 144 are electrically coupled to the conductive pillars 126, the conductive pillars 125, the conductive pillars 115, the conductive pillars 117, the active device die 50C, and the active device 50D. The UBMs 144 may be formed of the same material as the metallization pattern 132. In some embodiments, the UBMs 144 may have different sizes from the metallization patterns 132, 136, and 140.

Conductive connectors 146 are formed on the UBMs 144. The conductive connectors 146 may be ball grid array (BGA) connectors, solder balls, metal pillars, controlled collapse chip connection (C4) bumps, micro bumps, electroless nickel-electroless palladium-immersion gold technique (ENEPIG) formed bumps, or the like. The conductive connectors 146 may include a conductive material such as solder, copper, aluminum, gold, nickel, silver, palladium, tin, the like, or a combination thereof. In some embodiments, the conductive connectors 146 are formed by initially forming a layer of solder through evaporation, electroplating, printing, solder transfer, ball placement, or the like. Once a layer of solder has been formed on the structure, a reflow may be performed in order to shape the material into the desired bump shapes. In another embodiment, the conductive connectors 146 comprise metal pillars (such as a copper pillar) formed by a sputtering, printing, electro plating, electroless plating, CVD, or the like. The metal pillars may be solder free and have substantially vertical sidewalls. In some embodiments, a metal cap layer is formed on the top of the metal pillars. The metal cap layer may include nickel, tin, tin-lead, gold, silver, palladium, indium, nickel-palladium-gold, nickel-gold, the like, or a combination thereof and may be formed by a plating process.

In FIG. 20, the structure of FIG. 19 is flipped, the carrier substrate 102 is de-bonded from the back-side redistribution structure 106, e.g., the dielectric layer 108, openings (not separately illustrated) are formed in the dielectric layer 108, and a package component 150 is bonded to the back-side redistribution structure through conductive connectors 152 to form a packaged semiconductor device 300. In accordance with some embodiments, the de-bonding includes projecting a light such as a laser light or a UV light on the release layer 104 so that the release layer 104 decomposes under the heat of the light and the carrier substrate 102 can be removed. The structure is then flipped over. In some embodiments, the structure may be placed on a tape (not separately illustrated). The openings are formed through the dielectric layer 108 to expose portions of the metallization pattern 110. The openings may be formed, for example, using laser drilling, etching, or the like.

The package component 150 is then bonded to the back-side redistribution structure 106. In some embodiments, the package component 150 may be a memory die (e.g., a dynamic random access memory (DRAM) die, a low-power double data rate synchronous dynamic random access memory (LPDDR) die, a static random access memory (SRAM) die, a high bandwidth memory (HBM) die, or the like). In other embodiments, the package component 150 may be a logic die (e.g., central processing unit (CPU), a graphics processing unit (GPU), a system-on-a-chip (SoC), an application processor (AP), a microcontroller, or the like), an input/output (I/O) interface die, a power management die (e.g., a power management integrated circuit (PMIC) die or the like), a radio frequency (RF) die, a sensor die, a micro-electro-mechanical-system (MEMS) die, a signal processing die (e.g., a digital signal processing (DSP) die or the like), a front-end die (e.g., an analog front-end (AFE) die or the like), the like, or combinations thereof.

The package component 150 is bonded to the back-side redistribution structure 106 using conductive connectors 152. The conductive connectors 152 may be formed in the openings in the dielectric layer 108, may be provided on the package component 150, or a combination thereof. The conductive connectors 152 may be ball grid array (BGA) connectors, solder balls, metal pillars, controlled collapse chip connection (C4) bumps, micro bumps, electroless nickel-electroless palladium-immersion gold technique (ENEPIG) formed bumps, or the like. The conductive connectors 152 may include a conductive material such as solder, copper, aluminum, gold, nickel, silver, palladium, tin, the like, or a combination thereof. In some embodiments, the conductive connectors 152 are formed by initially forming a layer of solder through methods such as evaporation, electroplating, printing, solder transfer, ball placement, or the like. Once a layer of solder has been formed on the structure, a reflow may be performed in order to shape the material into the desired bump shapes. The package component 150 may be placed over the back-side redistribution structure 106 using a pick and place machine or the like. Once the package component 150 is placed, the conductive connectors 152 may be reflowed to bond the package component 150 to the back-side redistribution structure 106.

Including the back-side redistribution structure 106, the intermediate redistribution structure 170, and the front-side redistribution structure 128 in the packaged semiconductor device 300 allows for the active device die 50C (e.g., a WIO memory die) and the package component 150 (e.g., an LPDDR die or a DRAM die) with different input/output pad locations to be integrated with the active device die 50D (e.g., an SoC), thus offering flexibility in the choice of dies used for integration in the packaged semiconductor device 300. The conductive pillars 117 provide improved thermal dissipation. Copper-to-copper interfaces between the conductive pillars 115 and the back-side redistribution structure 106 and the intermediate redistribution structure 170 and between the conductive pillars 121/the conductive pillars 125 and the intermediate redistribution structure 170 and the front-side redistribution structure 128, reduce the resistance of the conductive pillars 115, the conductive pillars 121, and the conductive pillars 125, reducing the RC delay of the packaged semiconductor device 300 and improving signal integrity. Moreover, including oval-shaped and circular-shaped conductive pillars 115, 117, 121, and/or 125 reduces stress in the packaged semiconductor device 300.

In accordance with an embodiment, a method includes forming first conductive pillars over and electrically coupled to a first redistribution structure; attaching a first die to the first redistribution structure, the first die including second conductive pillars; attaching a second die to the first die adjacent the second conductive pillars; encapsulating the first conductive pillars, the first die, and the second die with an encapsulant; forming a second redistribution structure over the encapsulant, the first conductive pillars, the first die, and the second die; and bonding a third die to the first redistribution structure. In an embodiment, the first die is attached to the redistribution structure using a first adhesive, and the second die is attached to the first die using a second adhesive. In an embodiment, the method further includes attaching a dummy die to the first redistribution structure, the attaching the second die to the first die further including attaching the second die to the dummy die. In an embodiment, the method further includes forming the first die, the forming the first die including forming the second conductive pillars over a semiconductor substrate; attaching the semiconductor substrate and the second conductive pillars to a tape, the tape surrounding the second conductive pillars; thinning a back-side of the semiconductor substrate opposite the second conductive pillars; and singulating the first die. In an embodiment, the method further includes planarizing the encapsulant such that top surfaces of the encapsulant, the first conductive pillars, the second conductive pillars, and the second die are level with one another. In an embodiment, the first die, the second die, and the encapsulant are disposed on a first side of the first redistribution structure and the third die is disposed on a second side of the first redistribution structure opposite the first side.

In accordance with another embodiment, a device includes a first device bonded to a first side of a first redistribution structure; a second device attached to a second side of the first redistribution structure opposite the first side; a third device attached to the second device; a molding compound surrounding the second device and the third device; and a second redistribution structure over the second device, the third device, and the molding compound, the first device and the second device being electrically coupled to the third device using the second redistribution structure. In an embodiment, the first device includes a dynamic random access memory (DRAM) device, the second device includes a wide input/output (WIO) memory device, and the third device includes a system-on-chip (SoC). In an embodiment, the first device includes a low-power double data rate synchronous dynamic random access memory (LPDDR) device, the second device includes a wide input/output (WIO) memory device, and the third device includes a system-on-chip (SoC). In an embodiment, the device further includes first conductive pillars extending through the molding compound, the first conductive pillars being electrically coupled to the first redistribution structure and the second redistribution structure, the first device being electrically coupled to the third device through the first conductive pillars. In an embodiment, the device further includes second conductive pillars extending through the molding compound, the second conductive pillars being electrically coupled to the second device and the second redistribution structure, the second device being electrically coupled to the third device through the second conductive pillars. In an embodiment, the device further includes a dummy die disposed between the third device and the first redistribution structure, the dummy die including silicon.

In accordance with yet another embodiment, a device includes a first die attached to a first redistribution structure; a first molding compound over the first redistribution structure and surrounding the first die; first through vias extending through the first molding compound; a second redistribution structure over the first die, the first molding compound, and the first through vias; a second die attached to the second redistribution structure; a second molding compound over the second redistribution structure and surrounding the second die; and second through vias and third through vias extending through the second molding compound, the second through vias being electrically coupled to the first through vias, the second through vias including vias having circular-shaped cross sections, the third through vias being electrically coupled to the first die, the third through vias including vias having oval-shaped cross sections. In an embodiment, a distribution of the third through vias per unit area is greater than a distribution of the second through vias per unit area. In an embodiment, the second through vias have diameters in a top-down view from 50 µm to 120 µm, the third through vias have widths from 20 µm to 35 µm in the top-down view, and the third through vias have lengths from 35 µm to 50 µm in the top-down view. In an embodiment, the device further includes a third die bonded to the first redistribution structure opposite the first die, the third die being electrically coupled to the first through vias. In an embodiment, the device further includes a third redistribution structure over the second through vias, the third through vias, the second die, and the second molding compound, the second through vias and the third through vias being electrically coupled to the second die using the third redistribution structure. In an embodiment, the third die includes a low-power double data rate synchronous dynamic random access memory (LPDDR) die, the first die includes a wide input/output (WIO) memory die, and the third die includes a system-on-chip (SoC). In an embodiment, the third die is bonded to the first redistribution structure using solder bonds, the first die is attached to the first redistribution structure using a first adhesive, and the second die is attached to the second redistribution structure using a second adhesive. In an embodiment, the device further includes fourth through vias extending through the first molding compound, the fourth through vias being electrically isolated from the first die and the second die.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
forming first conductive pillars over and electrically coupled to a first redistribution structure;
attaching a first die to the first redistribution structure, the first die comprising second conductive pillars;
attaching a second die to the first die adjacent the second conductive pillars;
encapsulating the first conductive pillars, the first die, and the second die with an encapsulant;
forming a second redistribution structure over the encapsulant, the first conductive pillars, the first die, and the second die; and
bonding a third die to the first redistribution structure.

2. The method of claim 1, wherein the first die is attached to the redistribution structure using a first adhesive, and wherein the second die is attached to the first die using a second adhesive.

3. The method of claim 1, further comprising attaching a dummy die to the first redistribution structure, wherein the attaching the second die to the first die further comprises attaching the second die to the dummy die.

4. The method of claim 1, further comprising forming the first die, wherein forming the first die comprises:
forming the second conductive pillars over a semiconductor substrate;
attaching the semiconductor substrate and the second conductive pillars to a tape, the tape surrounding the second conductive pillars;
thinning a back-side of the semiconductor substrate opposite the second conductive pillars; and
singulating the first die.

5. The method of claim 1, further comprising planarizing the encapsulant such that top surfaces of the encapsulant, the first conductive pillars, the second conductive pillars, and the second die are level with one another.

6. The method of claim 1, wherein the first die, the second die, and the encapsulant are disposed on a first side of the first redistribution structure and the third die is disposed on a second side of the first redistribution structure opposite the first side.

7. A device comprising:
a first device bonded to a first side of a first redistribution structure;
a second device attached to a second side of the first redistribution structure opposite the first side;
a third device attached to the second device;
a molding compound surrounding the second device and the third device; and
a second redistribution structure over the second device, the third device, and the molding compound, wherein the first device and the second device are electrically coupled to the third device using the second redistribution structure.

8. The device of claim 7, wherein the first device comprises a dynamic random access memory (DRAM) device, wherein the second device comprises a wide input/output (WIO) memory device, and wherein the third device comprises a system-on-chip (SoC).

9. The device of claim 7, wherein the first device comprises a low-power double data rate synchronous dynamic random access memory (LPDDR) device, wherein the second device comprises a wide input/output (WIO) memory device, and wherein the third device comprises a system-on-chip (SoC).

10. The device of claim 7, further comprising first conductive pillars extending through the molding compound, the first conductive pillars being electrically coupled to the first redistribution structure and the second redistribution structure, the first device being electrically coupled to the third device through the first conductive pillars.

11. The device of claim 10, further comprising second conductive pillars extending through the molding compound, the second conductive pillars being electrically coupled to the second device and the second redistribution structure, the second device being electrically coupled to the third device through the second conductive pillars.

12. The device of claim 7, further comprising a dummy die disposed between the third device and the first redistribution structure, the dummy die comprising silicon.

13. A device comprising:
a first die attached to a first redistribution structure;
a first molding compound over the first redistribution structure and surrounding the first die;
first through vias extending through the first molding compound;
a second redistribution structure over the first die, the first molding compound, and the first through vias;
a second die attached to the second redistribution structure;
a second molding compound over the second redistribution structure and surrounding the second die; and
second through vias and third through vias extending through the second molding compound, the second through vias being electrically coupled to the first through vias, the second through vias comprising vias having circular-shaped cross sections, the third through vias being electrically coupled to the first die, the third through vias comprising vias having oval-shaped cross sections.

14. The device of claim 13, wherein a distribution of the third through vias per unit area is greater than a distribution of the second through vias per unit area.

15. The device of claim 13, wherein the second through vias have diameters in a top-down view from 50 µm to 120 µm, wherein the third through vias have widths from 20 µm to 35 µm in the top-down view, and wherein the third through vias have lengths from 35 µm to 50 µm in the top-down view.

16. The device of claim 13, further comprising a third die bonded to the first redistribution structure opposite the first die, the third die being electrically coupled to the first through vias.

17. The device of claim 16, further comprising a third redistribution structure over the second through vias, the third through vias, the second die, and the second molding compound, the second through vias and the third through vias being electrically coupled to the second die using the third redistribution structure.

18. The device of claim 17, wherein the third die comprises a low-power double data rate synchronous dynamic random access memory (LPDDR) die, wherein the first die comprises a wide input/output (WIO) memory die, and wherein the third die comprises a system-on-chip (SoC).

19. The device of claim 16, wherein the third die is bonded to the first redistribution structure using solder bonds, wherein the first die is attached to the first redistribution structure using a first adhesive, and wherein the second die is attached to the second redistribution structure using a second adhesive.

20. The device of claim 13, further comprising fourth through vias extending through the first molding compound, wherein the fourth through vias are electrically isolated from the first die and the second die.

\* \* \* \* \*